United States Patent
Tamir et al.

(10) Patent No.: US 11,139,828 B2
(45) Date of Patent: Oct. 5, 2021

(54) MEMORY COMPRESSION METHOD AND APPARATUS

(71) Applicant: SiliconIP, Inc., Austin, TX (US)

(72) Inventors: Dan E. Tamir, Round Rock, TX (US); Peter Jeremy Wilson, Leander, TX (US)

(73) Assignee: SiliconIP, Inc., Austin, TX (US)

( * ) Notice: Subject to any disclaimer, the term of this patent is extended or adjusted under 35 U.S.C. 154(b) by 0 days.

(21) Appl. No.: 16/826,824

(22) Filed: Mar. 23, 2020

(65) Prior Publication Data
US 2020/0228138 A1  Jul. 16, 2020

Related U.S. Application Data

(63) Continuation of application No. 16/419,199, filed on May 22, 2019, now Pat. No. 10,601,442, which is a continuation of application No. 16/043,952, filed on Jul. 24, 2018, now Pat. No. 10,340,945.

(60) Provisional application No. 62/536,167, filed on Jul. 24, 2017.

(51) Int. Cl.
*H03M 7/30* (2006.01)
*H03M 7/40* (2006.01)

(52) U.S. Cl.
CPC ....... *H03M 7/3086* (2013.01); *H03M 7/3088* (2013.01); *H03M 7/40* (2013.01); *H03M 7/4006* (2013.01)

(58) Field of Classification Search
CPC ............. H03M 7/3086; H03M 7/3088; H03M 7/4006; H03M 7/40
See application file for complete search history.

(56) References Cited

U.S. PATENT DOCUMENTS

| | | |
|---|---|---|
| 4,558,302 A | 12/1985 | Welch |
| 5,504,781 A | 4/1996 | Wolf |
| 5,708,431 A | 1/1998 | Howard |
| 6,405,199 B1 | 6/2002 | Carter et al. |
| 6,910,125 B2 | 6/2005 | Wise et al. |
| 7,490,078 B2 | 2/2009 | Lee et al. |
| 7,986,743 B2 | 7/2011 | Ho et al. |
| 8,149,711 B2 | 4/2012 | Schmidt et al. |
| 8,819,133 B2 | 8/2014 | Wang |
| 9,124,402 B2 | 9/2015 | Nabar et al. |
| 10,756,759 B2* | 8/2020 | Lahiri ................... G06F 16/221 |
| 10,903,851 B2* | 1/2021 | Finlay ................. H03M 7/3088 |
| 10,983,915 B2* | 4/2021 | Breslow .............. H03M 7/3088 |
| 2019/0028115 A1 | 1/2019 | Tamir et al. |
| 2019/0280710 A1 | 9/2019 | Tamir et al. |

OTHER PUBLICATIONS

Office Action for U.S. Appl. No. 16/043,952, dated Oct. 25, 2018, Tamir et al, "Memory Compression Method and Apparatus", 5 pages.
Office Action for U.S. Appl. No. 16/419,199, dated Jul. 25, 2019, Tamir, "Memory Compression Method and Apparatus", 5 pages.

* cited by examiner

*Primary Examiner* — Brian K Young

(74) *Attorney, Agent, or Firm* — Lee & Hayes, P.C.

(57) ABSTRACT

Methods and systems for encoding of integers are discussed. For example, various methods and systems may utilize Huffman coding, Tunstall coding, Arithmetic Coding, LZ77 coding, LZ78 coding, LW coding, or Shannon Fano Elias coding to encode the integers.

20 Claims, 20 Drawing Sheets

MEMORY COMPRESSION METHOD AND APPARATUS

CROSS-REFERENCE TO RELATED APPLICATION(S)

This application is a continuation of and claims priority to U.S. application Ser. No. 16/419,199 filed on May 22, 2019 and entitled, "Memory Compression Method and Apparatus," issuing as U.S. Pat. No. 10,601,442 on Mar. 24, 2020, which is a continuation of U.S. application Ser. No. 16/043,952, filed on Jul. 24, 2018, and entitled "Memory Compression Method and Apparatus," issued as U.S. Pat. No. 10,340,945 on Jul. 2, 2019, which is a non-provisional of and claims priority to U.S. Provisional Application No. 62/536,167 filed on Jul. 24, 2017 and entitled "Unbounded Integer Compression," which are incorporated herein by reference in their entirety.

BACKGROUND OF THE INVENTION

Integer compression is essential in numerous systems including communication, multimedia, information retrieval systems, and computer networks as well as VLSI intra-connect and interconnect networks. In numerous cases where digital data is stored or transmitted, integer compression can be used to reduce the bandwidth consumed and/or the memory required to manage data. Major applications include compression of network, image, video, audio, speech, and fax data in products as varied as file compression, cell phones, online backup, and storage media. Additionally, Integer compression is useful for efficient retrieval of information from the Internet.

In 1951, Huffman developed a uniquely decodable (UD) method for lossless compression of information containing finite length symbols from a finite alphabet with a known probability distribution. Using coding techniques such as those developed by Elias, Zeckendorf (Fibonacci coding), and Golomb, lossless compression was subsequently extended to unbounded integers without a finite bit length. These innovations prompted extensive algorithmic exploration in the 1970s and early 1980s, resulting in the development of a series of ground-breaking compression algorithms and systems (LZ77, LZ78, LZW, etc.).

Most compression techniques have two variations: a static and a dynamic approach. A static compression technique requires that both the encoder and the decoder share a predictive model. When the data to be sent matches the output from the model, the encoder can usually transmit the data at a lower information cost by transmitting the output from the model. Static methods for string compression include: Huffman codes, Tunstall codes, and static dictionaries. Static methods for unbounded integer compression include the Elias family of codes, Fibonacci coding, Golomb Coding, and other methods.

Dynamic compression does not need a shared predictive model, but instead requires the encoder and decoder to have a shared meta-model (method) defining how each will alter their models in response to the actual data. Consequently, using dynamic compression, no initial model need be shared. Well known and extensively used dynamic lossless compression algorithms include: dynamic Huffman coding, dynamic Tunstall coding, dynamic Arithmetic coding, and the dynamic dictionary methods derived via the application and extension of the Lempel and Ziv (LZ) algorithms known as LZ77 and LZ78. Many of these algorithms are used in communication and information processing, as well as in multimedia systems and devices. A dynamic encoding and decoding process might involve items that have not been encountered yet by the encoder (and the decoder) and items that have been encountered.

At each given point of the dynamic process, the encoder and the decoder might maintain a list of all the items that have been encountered so far which is often referred to as the already transmitted (AT) list. When a new item arrives, the encoder (decoder) may check if the item is already in the AT list by searching the AT list. In similarity to caching systems, we may refer to the event where the search for a new item is successful and the item is in AT as a "hit." We refer to the case where the new item is not in AT as a miss. Different methods may distinguish between these two events (hit and miss) via a flag bit or a flag string. Alternatively, the distinction may be denoted by an exception code. Additionally, several of the encoding and decoding processes may need to estimate the probability of occurrence of specific items. This may be done by maintaining a counter. For example, the counter $N(a)$ may be used to count the number of occurrences of the integer a in a given time interval. In this case, $N(a)$ may be used to estimate the probability of occurrence of a. The plurality of counters, each of which, is dedicated to count occurrences of specific integers may be used to estimate the probability distribution function of an items that belong to a specific information source. Nevertheless, other methods for estimating the PDF may be used. In some cases, information about the PDF is available prior to the encoding and can be exploited in the encoding process.

Despite the relative success of these known methods, there is still a need for improved methods of lossless integer compression that can be used to extend and improve several existing dynamic lossless data compression systems.

In most applications, the input integers are bounded. Nevertheless, for the case where there is no prior knowledge concerning the magnitude of input integers, one may assume that they are represented using some kind of a comma system which enables identifying the boundaries of input integers. Other uniquely decodable representations may be considered. Hence, a stream of unbounded integers may be represented using a uniquely decodable variable length code. In some cases, the Elias Delta Code of the integers may be utilized as a uniquely decodable (UD) infinite alphabet on which the methods operate. Alternatively, the Elias Delta code may be generated as a part of the integer encoding and decoding process.

BRIEF DESCRIPTION OF THE DRAWINGS

The detailed description is provided with reference to the accompanying figures. In the figures, the left-most digit(s) of a reference number identifies the figure in which the reference number first appears. The use of the same reference numbers in different figures indicates similar or identical components or features.

DETAILED DESCRIPTION

Figure 1:
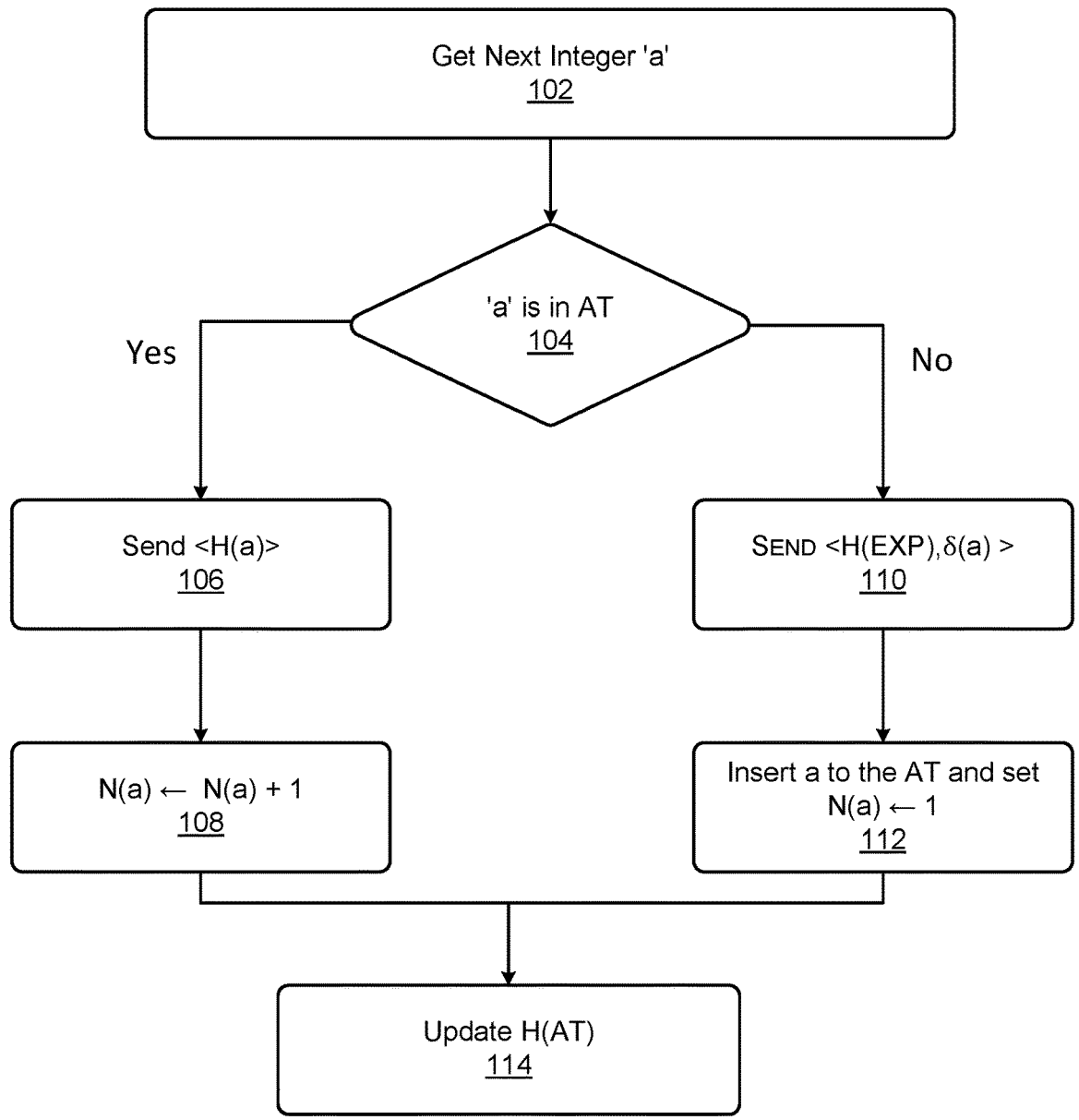
FIG. 1 is example flow diagram showing an illustrative process for encoding an integer according to some implementations.

Dynamic Huffman Compression of Unbounded Integers (δ-Huffman)

In this compression method, a system utilizing dynamic Huffman coding is discussed. The description refers to two lists. The first, is the "not yet transmitted" (NYT) list, which is a virtual list, that initially includes the set of integers indexed according to their integer value. Hence the NYT index of the integer i is i. The second list is the "Already Transmitted" (AT) list, which is initialized to be an empty list. This list maintains a log of each integer (say i) that have been encountered so far along with the current number of the occurrences of this integer, N(i) (referred to as the weight of this integer). The encoder and the decoder maintain their own versions of the NYT and the AT.

δ-Huffman Compression of Unbounded Integers

In general, in the first encounter with an integer j from NYT it is encoded using the Elias delta code of j, (δ(j)). The encoder sends an exception code, or a flag appended with δ(j) to the decoder, removes j from encoder's NYT, places it in the encoder's AT with a weight of 1, and updates (or creates in the first iteration) the Huffman code of the integers residing in the encoder's AT list. The decoder receives the encoded version of j, decodes it, removes j from the decoder's NYT, places it in the decoder's AT with a weight of 1, and updates (or creates in the first iteration) the Huffman code of the integers residing in the decoder's AT. One skilled in the art would understand that there are several known techniques for efficient update of a dynamic Huffman code.

On the other hand, in any encounter with an integer j that resides in the encoder's AT, the encoder sends the Huffman code of j, potentially prepended by an exception code or a flag to the decoder, increments the weight of j in AT by 1, and updates the Huffman code of the integers residing in encoder's AT. The decoder receives the encoded version of j, decodes it, increments the weight of j in AT by 1, and updates the Huffman code of the integers residing in decoder's AT.

Discussed below is an example of a method that uses the Huffman code of a special symbol referred to as Exp to denote an exception (i.e., Exp denotes the first encounter with an integer j). We use the term 'hit' to denote the event that the current encoder's input integer is in AT. If it is not in AT, we refer to this as a 'miss.'

In a specific example, the encoder's NYT, which is a virtual list, is initialized to include the set of all integers indexed according to their value. The encoder's AT list is initialized to include a special symbol 'Exp' that denotes the exception of the occurrence of an integer that has not been encountered so far. The weight of the Exp symbol is tightened to 0. It is further assumed that the initial Huffman code of Exp is 0 (but it may be 1 in some embodiments). Upon the arrival of an un-encountered integer (say, j), j is removed from the NYT. It is added to the "already transmitted" (AT) list with a weight of 1. The Huffman code of Exp (H(Exp)), along with the Elias delta code of j (δj)) are transmitted to the decoder. That is, the system transmits ⟨(H(Exp), δ(j)⟩. Next, using the updated AT, the current encoder Huffman code of the integer residing in AT is efficiently updated.

In a specific example, when an integer (say j) that belongs to AT arrives at the encoder, it is encoded via its current Huffman code. That is, we transmit ⟨H(j)⟩. Next, its weight in the AT list is incremented by 1. Finally, using the updated AT, the current encoder's Huffman code of the integers residing in AT is efficiently updated. Hence, the current code reflects all the integers that reside in the AT, i.e., all the integers encountered so far. One code-word, however, represents the Exception symbol, Exp. The integer may then be decoded as the encoded integer is uniquely defined by the definition of the encoder, as one skilled in the art would understand.

FIG. 1 is example flow diagram showing an illustrative process 100 for encoding an integer according to some implementations. The process 100 includes a flow-chart of the δ-Huffman encoding process defined above where an exception code distinguishes between a hit and a miss in the AT list. At 102, the encoder gets the next unbounded integer (a) in the stream of integers to be encoded. At 104, the encoder checks if a is in AT. If a does not reside in AT then the process 100 proceeds to 110. At 110, the encoder sends the code ⟨H(Exp), δ(a)⟩ representing a "miss" exception code and the Elias delta code of a. Next, at 112, the encoder inserts a to AT and assign a weight of 1 to a, i.e., N(a) is set to 1. On the other hand, if a is in AT, then the process 100 moves to 106. At 106, the encoder produces and sends the Huffman code of a (H(a)) representing that a hit in AT occurred and transmitting the Huffman code of the integer a. At 108, the encoder increments the value of N(a), the counter of the number of occurrences of a in the integer stream, by 1 (N(a)←N(a)+1). Both 108 and 110 proceed to 110 where the Huffman code of the integers residing in AT (H(AT)) is updated by the encoder.

Next, we describe decoder embodiments. A person that is skilled in the art, however, can derive the decoding process described below from the definition of the encoder.

Figure 2:
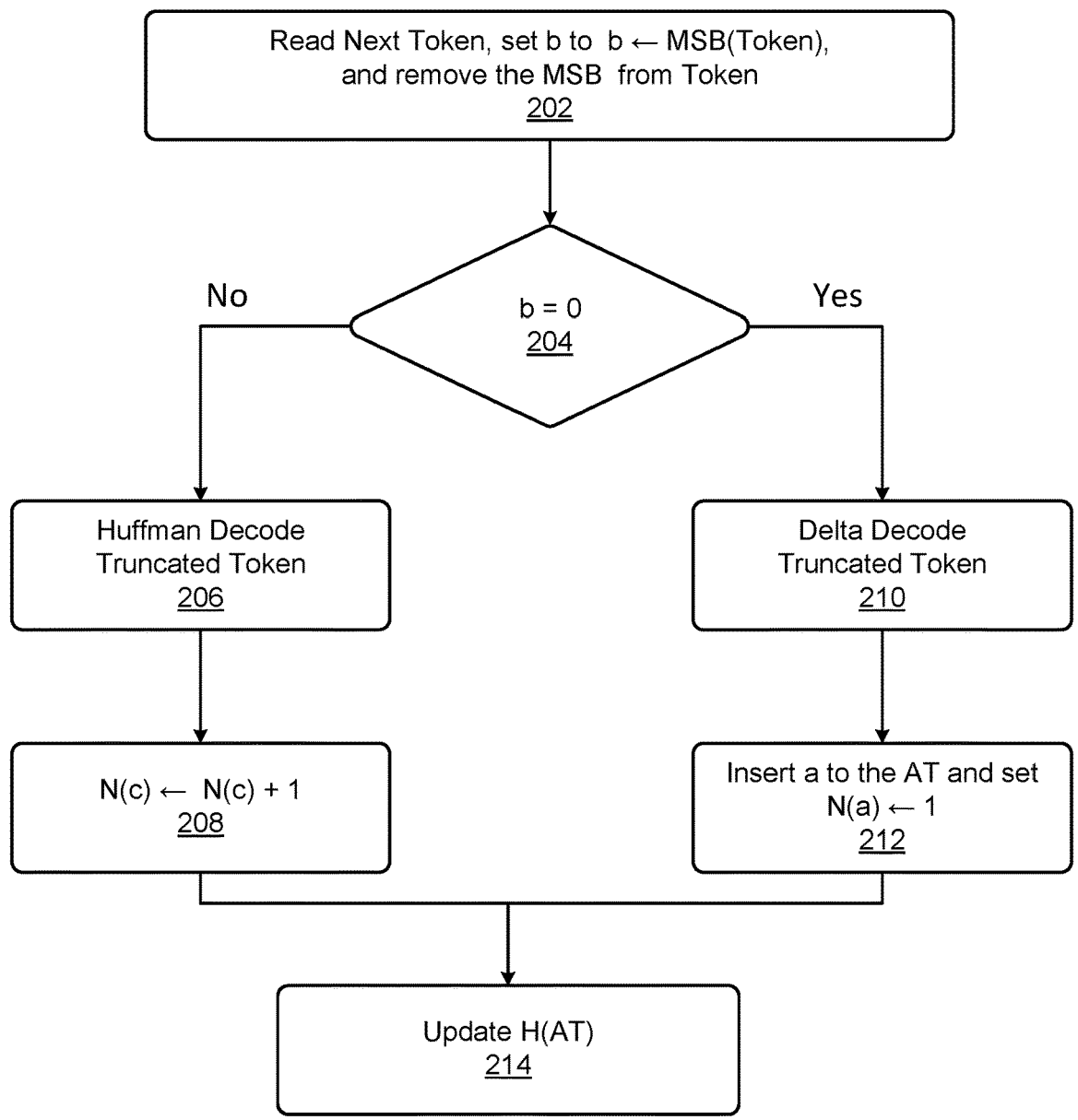
FIG. 2 is example flow diagram showing an illustrative process for decoding an integer according to some implementations.

FIG. 2 is example flow diagram showing an illustrative process 200 for decoding an integer according to some implementations. FIG. 2 includes a flow-chart of the δ-Huffman decoding process, where an exception code distinguishes between a hit and a miss in the encoder's AT list. The decoder gets a stream of bits that include Huffman encoded tokens. A token might include the Huffman code of the exception (H(Exp)) followed by the Elias delta code of an un-encountered integer a (δ(a)). Alternatively, the token is the Huffman code of an integer b (H(b)). At 202, the decoder applies Huffman code to the current token and, at 204, checks if the token is H(Exp). If it is H(Exp), then the process 200 advances to 210. At 210, the decoder reads and decodes the next token in the stream, using Elias delta code and obtains an integer (say a). Next, in 212, the decoder inserts a into its AT list and set the counter of a (N(a)) to 1. Otherwise, if the token has already been encountered the process 200 moves to 206. At 206, the decoder decodes the next token in the stream using the current Huffman code and obtains the integer (say b). Next at 208, the decoder increments the counter of b (N(b)) to be N(b)=N(b)+1. Both 208 and 212 lead to 240 where the Huffman code of the decoder's AT integers (H(AT)) is updated.

Dynamic Tunstall Compression of Unbounded Integers (δ-Tunstall)

Due to the duality between Huffman code and Tunstall code, the dynamic Tunstall compression, using Elias delta code for representing the alphabet follow immediately from the analysis of the methodology of dynamic Huffman compression of unbounded integer. Nevertheless, we discussed here a second option to distinguish between members of AT and members of NYT. Namely, prepending a distinct flag bit to instances of members of each list.

δ-Tunstall Compression of Unbounded Integers

In this compression method, a system to utilize dynamic Tunstall coding is discussed. The description refers to two lists. The first, is the "not yet transmitted" (NYT) list, which is a virtual list, that initially includes the set of integers indexed according to their integer value. Hence the NYT index of the integer i is i. The second list is the "Already Transmitted" (AT) list, which is initialized to be an empty list. This list maintains a log of each integer (say i) that have been encountered so far along with the current number of the occurrences of this integer, N(i) (referred to as the weight of this integer). The encoder and the decoder maintain their own versions of the NYT and the AT.

In some cases (e.g., the system 300 described below), initially, the encoder's NYT, which is a virtual list, includes the set of all integers indexed according to their value. Upon the arrival of an un-encountered integer (say, j), j is removed from the NYT. It is added to the "already transmitted" (AT) list with a weight of 1. A flag with a value of 0 is appended to the Elias delta code of j (δ(j)) the flag and the Elias delta code are transmitted to the decoder. That is, we transmit ⟨0,δ(j)⟩. Next, using the updated AT, the current encoder Huffman code of the integer residing in AT is efficiently updated.

In other cases, when an integer (say j) that belongs to AT arrives at the encoder, it is encoded and transmitted via a second flag with a value of 1 prepended to its current Tunstall code. That is, we transmit ⟨1,T(j)⟩. Next, its weight in the AT list is incremented by 1. Finally, using the updated AT, the current encoder's Tunstall code of the integers residing in AT is efficiently updated. Hence, the current code reflects all the integers that reside in the AT i.e., all the integers encountered so far.

Figure 3:
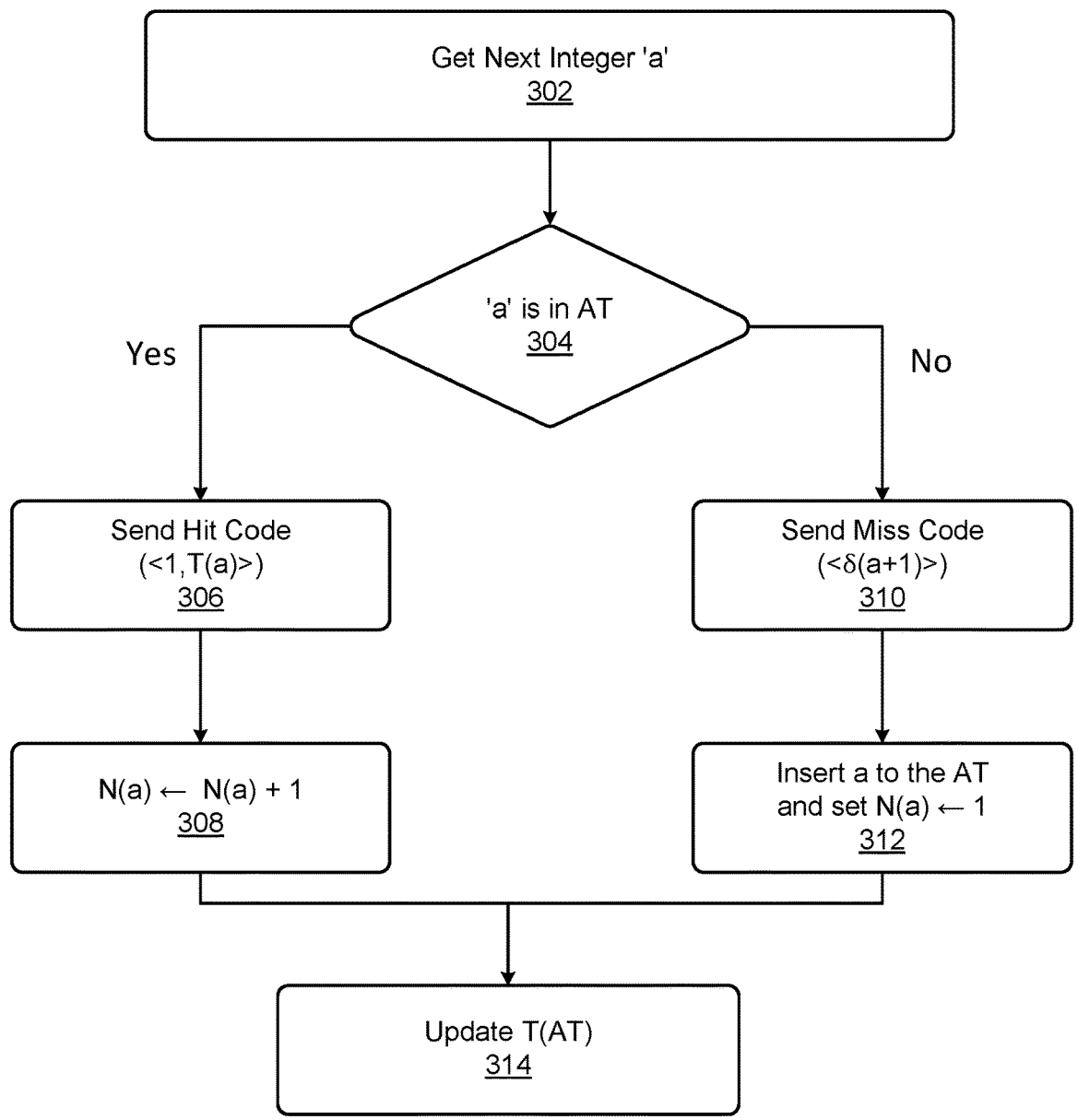
FIG. 3 is example flow diagram showing an illustrative process for encoding an integer according to some implementations.

FIG. 3 is example flow diagram showing an illustrative process 300 for encoding an integer according to some implementations. FIG. 3 includes a flow-chart of the δ-Tunstall encoding process defined above, where a flag distinguishes between a hit or a miss in the AT list. At 302, the encoder gets the next unbounded integer (a) in the stream of integers to be encoded. At 304, the encoder checks if a is in AT. If a does not reside in AT, then the process 300 proceeds to 310. At 310, the encoder sends the code ⟨0,δ(a)⟩ representing a "miss" flag and the Elias delta code of a. Next, at 312, the encoder inserts a to AT and assign a weight of 1 to a. On the other hand, if a is in AT, then the process 300 advances to 306. At 306, the encoder sends the flag '1' concatenated with the Tunstall code of a (T(a)). This represents the event of a hit in AT and, at the same time, the transmission of the Tunstall code of the integer a that has been hit. At 308, the encoder increments the value of N(a), the counter of the number of occurrences of a in the integer stream by 1. Both 308 and 312 lead to 310 where the Tunstall code of AT integers (T(AT)) is updated.

Next, we describe decoder embodiments. A person that is skilled in the art, however, can derive the decoding process described below from the definition of the encoder.

Figure 4:
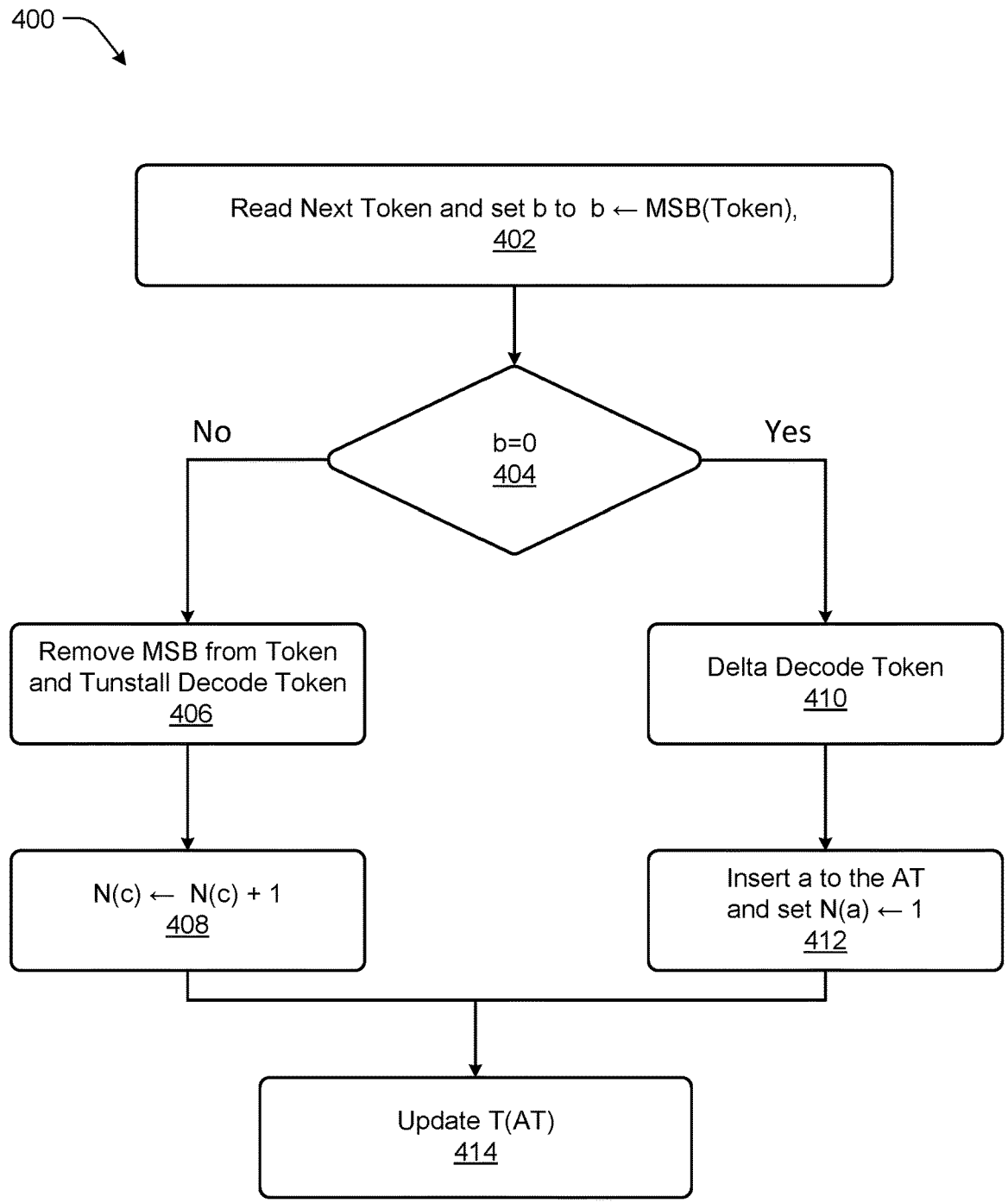
FIG. 4 is example flow diagram showing an illustrative process for decoding an integer according to some implementations.

FIG. 4 is example flow diagram showing an illustrative process 400 for decoding an integer according to some implementations. FIG. 4 includes a flow-chart of the δ-Tunstall decoding process, where a flag distinguishes between a hit and a miss in the encoder's AT list. The decoder gets a stream of bit representing tokens that include flags and Tunstall codes of integers. At 402, the decoder reads the next token and extracts the MSB bit, which is the first bit in the currently unprocessed stream. This bit is the flag bit. The encoder stores this bit in a i-bit variable b and remove the MSB from token. At 404, the decoder checks if the flag-bit (b) is 0 denoting that the next token is the Elias delta code of an integer that was not encountered so far. If b=0, then the process proceeds to 410. At 410, the decoder decodes the MSB truncated version of the token using Elias delta coding and obtains an integer a. Next at 412, the decoder inserts a into its AT list and set the weight of a (N(a)) to 1. Otherwise, if the b=1, then the process 400 advances to 406. At 406, the decoder decodes the MSB truncated version of the token using the current Tunstall coding and obtains an integer (say c). Next at 408, the decoder increments the counter of a (N(c)) to be N(c)=N(c)+1. Both 408 and 412 lead to 414 where the Tunstall code of the decoder's AT integers (T(AT)) is updated.

Dynamic Arithmetic Coding of Unbounded Integers (δ-AC)

The arithmetic coding (AC) algorithm maps a string of characters from a finite or countably infinite alphabet into a fixed-point representation of the boundaries of a band of the [0, 1) interval of the real numbers.

δ-AC Compression of Unbounded Integers

By design, arithmetic coding can be used for static compression of strings produced by a source with a finite alphabet. However, it requires a priori knowledge of the Probability Distribution Function (PDF) of the alphabet characters. Dynamic arithmetic coding of strings over finite alphabet can start by assuming that all the letters of the alphabet have the same probability of occurrence and updating the probability as new data is accumulated.

Dynamic arithmetic coding of unbounded integers with unknown PDF introduces a challenge. The probability of occurrences of integers is not known and, due to the cardinality of the set being ℵ 0, it is not possible to assume that initially all the NYT integers have the same probability of occurrence. Hence, initially it is not possible to map NYT integers to bands. Yet, the encoder must have a UD way to inform the decoder concerning the identity of the first occurrences of NYT integers. Thus, for the first occurrence of these integers the encoder must adapt an efficient UD representation of the integers before starting to produce a dynamic estimate of the probability of these integers. This, however, can be achieved using Elias delta coding. In one embodiment, the following algorithm may be used:

1. The first occurrence of the integer j is encoded as ⟨0,δ(j)⟩. The integer j is placed in the AT and it is being assigned with a weight of 1.
2. Any occurrence of an integer from AT, results in incrementing its weight and updating the current set of bands accordingly.
3. The algorithm proceeds in a way that is identical to standard arithmetic coding procedure applying either (1) or (2), eventually sending a unique minimal label, in the form of a fixed-point fraction of the final band along with a prefix of '1'.

Figure 5:
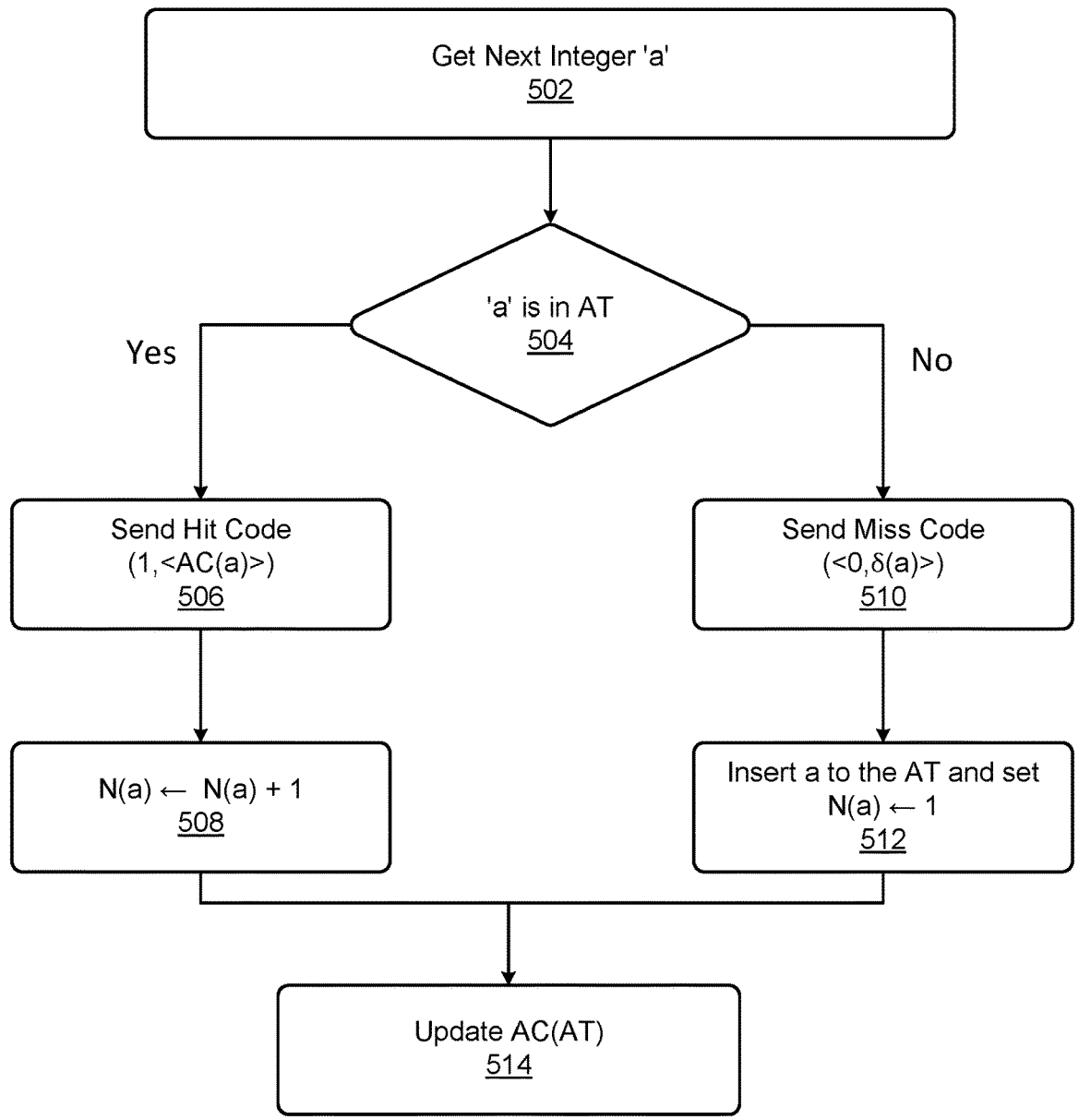
FIG. 5 is example flow diagram showing an illustrative process for encoding an integer according to some implementations.

FIG. 5 is example flow diagram showing an illustrative process 500 for encoding an integer according to some implementations. FIG. 5 includes a flow-chart of the δ-AC encoding process defined above, where a flag distinguishes between a hit or a miss in the AT list. At 502, the encoder gets the next unbounded integer (a) in the stream of integers to be encoded. At 504, the encoder checks if a is in AT. If a does not reside in AT, then the process 500 proceeds to 510. At 510, the encoder sends the code {0,δ(a)} representing a "miss" flag via Elias delta code of a. Next, at 512, the encoder inserts a to AT and assign a weight of 1 to a. On the other hand, if a is in AT, then the process 500 advances to 506. At 506, the encoder sends the flag '1' concatenated with the arithmetic code of a (AC(a)) i.e., ⟨1, AC(a)⟩. This represents the event of a hit in AT and, at the same time, the transmission of the arithmetic code of the integer a that has been hit. At 508, the encoder increments the value of N(a), the counter of the number of occurrences of a in the integer stream by 1. Both 508 and 512 lead to 514 where the arithmetic code of AT (AC(AT)) is updated.

Variants of arithmetic coding may encode strings of symbols rather than one symbol at a time. In this case, the encoder may store all the occurrences of integer that do not reside in AT ([$a_1, a_2, \ldots, a_k$]), until a complete string of integers ([$b_1, b_2, \ldots, b_n$]) that resides in AT is received. At this point, the encoder updates the weight of the members of the set {$a_1, a_2, \ldots, a_k$} to $N(a_i)=1$ (as in 512). At the same time the encoder updates the weight of the members of the set {$b_1, b_2, \ldots, b_k$} to $N(b_i)=N(b_i)+1$ (as in 508).

Next, we describe an example of a decoder embodiment. A person that is skilled in the art, however, can derive the decoding process described below from the definition of the encoder.

Figure 6:
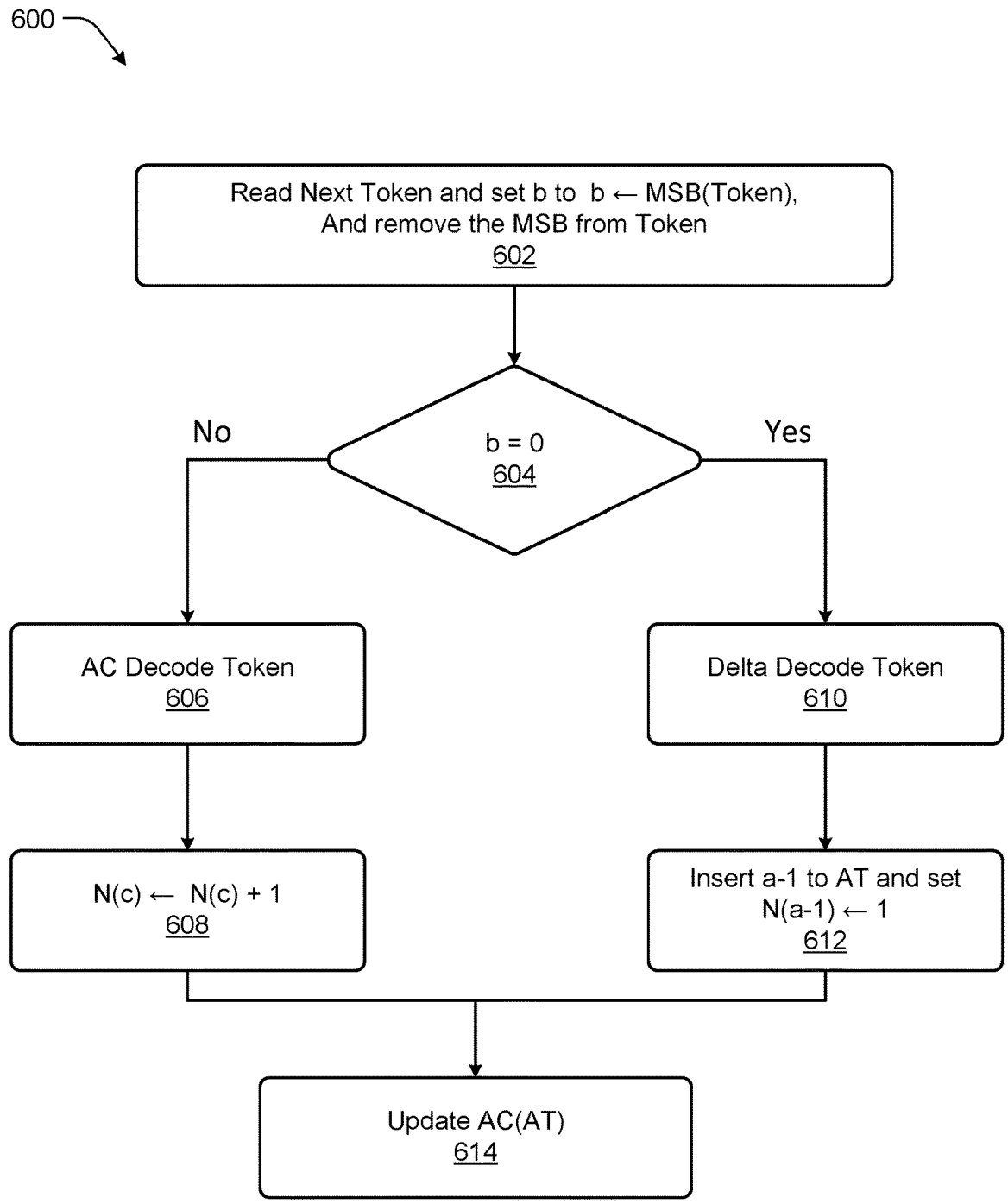
FIG. 6 is example flow diagram showing an illustrative process for decoding an integer according to some implementations.

FIG. 6 is example flow diagram showing an illustrative process 600 for decoding an integer according to some implementations. FIG. 6 includes a flow-chart of the δ-AC decoding process, where a flag distinguishes between a hit and a miss in the encoder's. At 602, the decoder reads the next token and extracts the MSB of the token, which denotes the flag, into a one bit variable b. In 604, the decoder checks if the b=0 denoting that the next token is the delta code of an integer a that has not been encountered so far. If b=0, then the process proceeds to 610. At 610, the decoder decodes the next token in the stream using Elias delta code and obtain an integer a. Next at 612, the decoder inserts a into its AT list and set the counter of a (N(a)) to 1. Alternatively, the token is the AC code of an integer b (AC(c)). Hence, if the value of b encountered in 604 is 1, then the process 600 advances to 606. At 606 the decoder decodes it using arithmetic code and obtains c. Next at 608, the decoder increments the counter of c (N(c)) to be N(c)=N(c)+1. Both 608 and 612 lead to 614 where the arithmetic code of the decoder's AT (AC(AT)) is updated.

Dynamic Shannon Fano Elias of Unbounded Integers (δ-SFE)

The SFE coding algorithm maps a string of characters from a finite or countably infinite alphabet into a fixed-point representation of the boundaries of a band of the [0, 1) interval of the real numbers. We first discuss a way for improving the performance of SFE for bounded and unbounded integers, then we proceed to provide an example embodiment of δ-SFE.

Given a discrete random variable X of ordered values to be encoded, let {\displaystyle p(x)} p(x) be the probability for any x∈X. Define a function $\bar{F}(x) = \Sigma_{x_i < x} p(x_i) + \frac{1}{2} p(x)$ For each x∈X; Let Z be the binary expansion of {\displaystyle {\bar {F}}(x)}$\bar{F}$(x). Choose the length of the encoding of x, L(x) to be the integer $$\left\lceil \log_2\left(\frac{1}{p(x)}\right) + 1 \right\rceil + 1.$$

The SFE code of x (SFE(x)) is defined to be the first L(x){\displaystyle L(x)} most significant bits after the decimal point of Z.

Algorithm for improving the performance of Shannon Fano Elias code.
1) Use the process described above to determine the number bits (n) for the element with the smallest probability. Compute the binary representation of each symbol using n-bits appending 0s as needed.
2) Generate two sets {X, Y}
   a. Assign an empty code-string to group X and an empty code-string to group Y.
3) Assign all the symbols with code that starts with an MSB of 0 to group X and all the symbols with code that has an MSB of 1 to group Y.
   i. Assign a 0 to group X and 1 to group Y.
   ii. Remove the MSB from the code of each member of each group
   iii. If a group contains only one element, then the code assigned so far is the code for the element.
4) If all the groups are singletons, then stop.
5) Otherwise break each group that contains more than one element to two and apply step (3) recursively to all the remaining groups δ-SFE Compression of Unbounded Integers In one embodiment, the following algorithm may be used:
1. The first occurrence of the integer j is encoded as (δ(j+1)). The integer j is placed in the AT and it is being assigned with a weight of 1.
2. Any occurrence of an integer from AT, results in incrementing its weight and updating the current set of bands accordingly.

3. The algorithm proceeds in a way that is identical to standard SFE coding procedure applying either (1) or (2), eventually sending a unique minimal label, in the form of a fixed-point fraction of the final band along with a prefix of '1'.

The embodiment described below exploits the fact that the Elias delta code of every integer i, such that i>1 has a prefix of 0. Other methods for representing the event of first occurrence of an integer (i.e., a miss in the AT list) include using an exception code or a flag.

Figure 7:
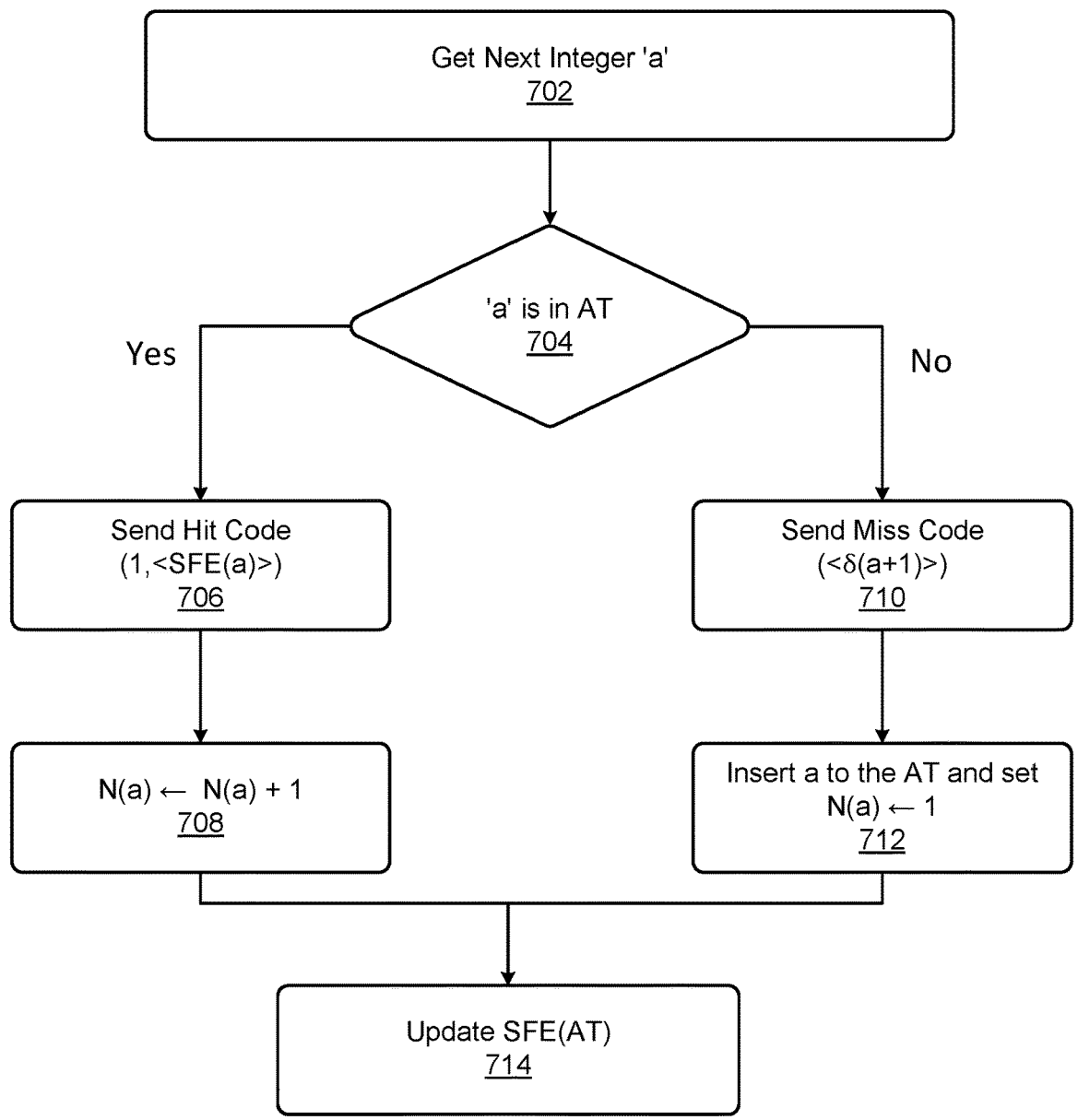
FIG. 7 is example flow diagram showing an illustrative process for encoding an integer according to some implementations.

FIG. 7 is example flow diagram showing an illustrative process 700 for encoding an integer according to some implementations. FIG. 7 includes a flow-chart of the δ-SFE encoding process defined above, where a flag imbedded in the code distinguishes between a hit or a miss in the AT list. At 702, the encoder gets the next unbounded integer (a) in the stream of integers to be encoded. At 704, the encoder checks if a is in AT. If a does not reside in AT, then the process 700 proceeds to 710. At 710, the encoder sends the code $\langle \delta(a+1) \rangle$ representing a "miss" flag via Elias delta code of a+1 which starts with a bit of 0 for every integer a>1. Next, at 712, the encoder inserts a to AT and assigns a weight of 1 to a. On the other hand, if a is in AT, then the process 700 advances to 706. At 706, the encoder sends the flag '1' prepended to the SFE code of a (SFE(a)). This represents the event of a hit in AT and, at the same time, the transmission of the Shannon Fano Elias code of the integer a that has been hit. At 708, the encoder increments the value of N(a), the counter of the number of occurrences of a in the integer stream by 1. Both 708 and 712 lead to 714 where the SFE code of AT integers (SFE(AT)) is updated.

Next, we describe an example of a decoder embodiment. A person that is skilled in the art, however, can derive the decoding process described below from the definition of the encoder.

Figure 8:
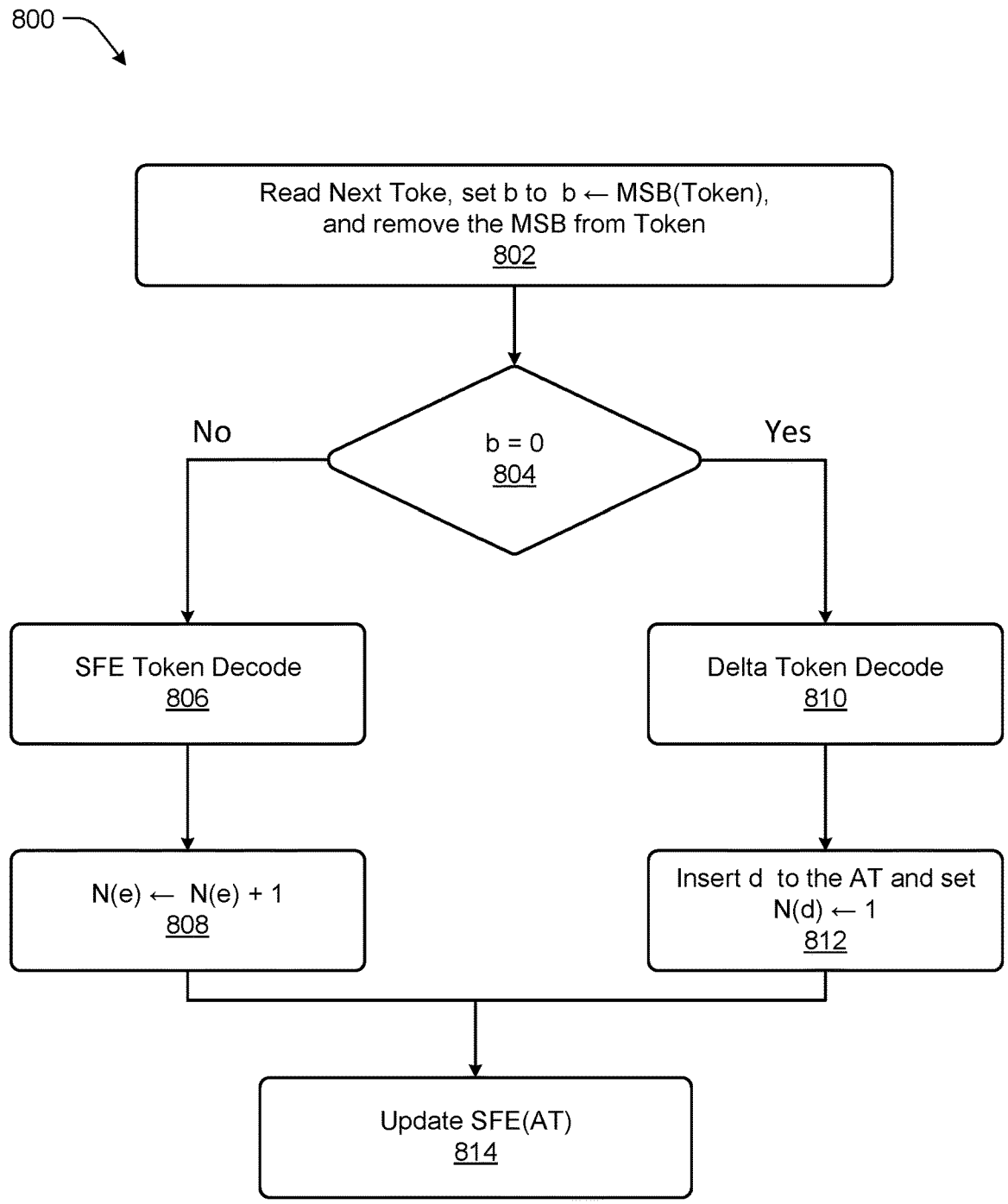
FIG. 8 is example flow diagram showing an illustrative process for decoding an integer according to some implementations.

FIG. 8 is example flow diagram showing an illustrative process 800 for decoding an integer according to some implementations. FIG. 8 includes a flow-chart of the δ-SFE decoding process, where a flag distinguishes between a hit and a miss in the encoder's AT list. In the case, the flag however, is gendered by either providing the Elias delta code of a+1, rather than the Elias delta code of a, resulting in a code that starts with the bit of 0, or by appending 1 to the SFE of a. Hence, the decoder gets a stream of bits that include flags and SFE codes of integers. At 802, the decoder reads the next token and extracts the MSB of the token, which contains the flag, into a one bit variable b. In 804, the decoder checks if b=0 denoting that the next token is the delta code of an integer a+1 where a is an integer that has not been encountered so far. If b=0, then the process proceeds to 810. At 810, the decoder decodes the next token in the stream using Elias delta code and obtains an integer c. Next at 812, the decoder inserts d=c−1 into its AT list and set the counter of d (N(d)) to 1. Otherwise, if the value of b encountered in 804 is 1, then the process 800 advances to 806. At 806, the decoder decodes the token using SFE coding and obtains an integer (say e). Next at 808, the decoder increments the counter of e (N(e)) to be N(e)=N(e)+1. Both 808 and 812 lead to 814 where the SFE code of the decoder's AT integers (ESF(AT)) is updated.

LZ77 Coding of Unbounded Integers (δ-LZ77)

The LZ77 algorithm is a dynamic lossless data compression algorithm developed by Lempel and Ziv and described in detail in their 1977 paper. The algorithm uses a sliding window that keeps "history" (i.e., previous input) in a history-buffer and enables the encoder to "look ahead" into data that have not been processed which is kept in the look-ahead buffer. As in many dynamic data compression algorithms the encoder and the decoder work in tandem where the decoder can reconstruct the history buffer and infer the current input (parts of the encoder look ahead). Theoretically, the algorithm is universal. Practically, in many cases it provides competitive compression ratio. Additionally, it lends itself to an efficient hardware implementation. Numerous variants and improvements of the LZ77 as well as multitude of hardware accelerators for the algorithm have been developed. In specific LZ78 and LZW which are described below have been introduced. The method described here (δ-LZ77) is applicable to may of the variants and improvements. In specific it is applicable to the LZSS algorithm and a person that is skilled in the art, can derive the δ-LZSS as well as other embodiments from the definition of δ-LZ77 provided here. The LZ77 version is an VLC to FLC string compression version, where strings of variable length are mapped into fixed length code.

δ-LZ77 Compression of Unbounded Integers

Figure 9:
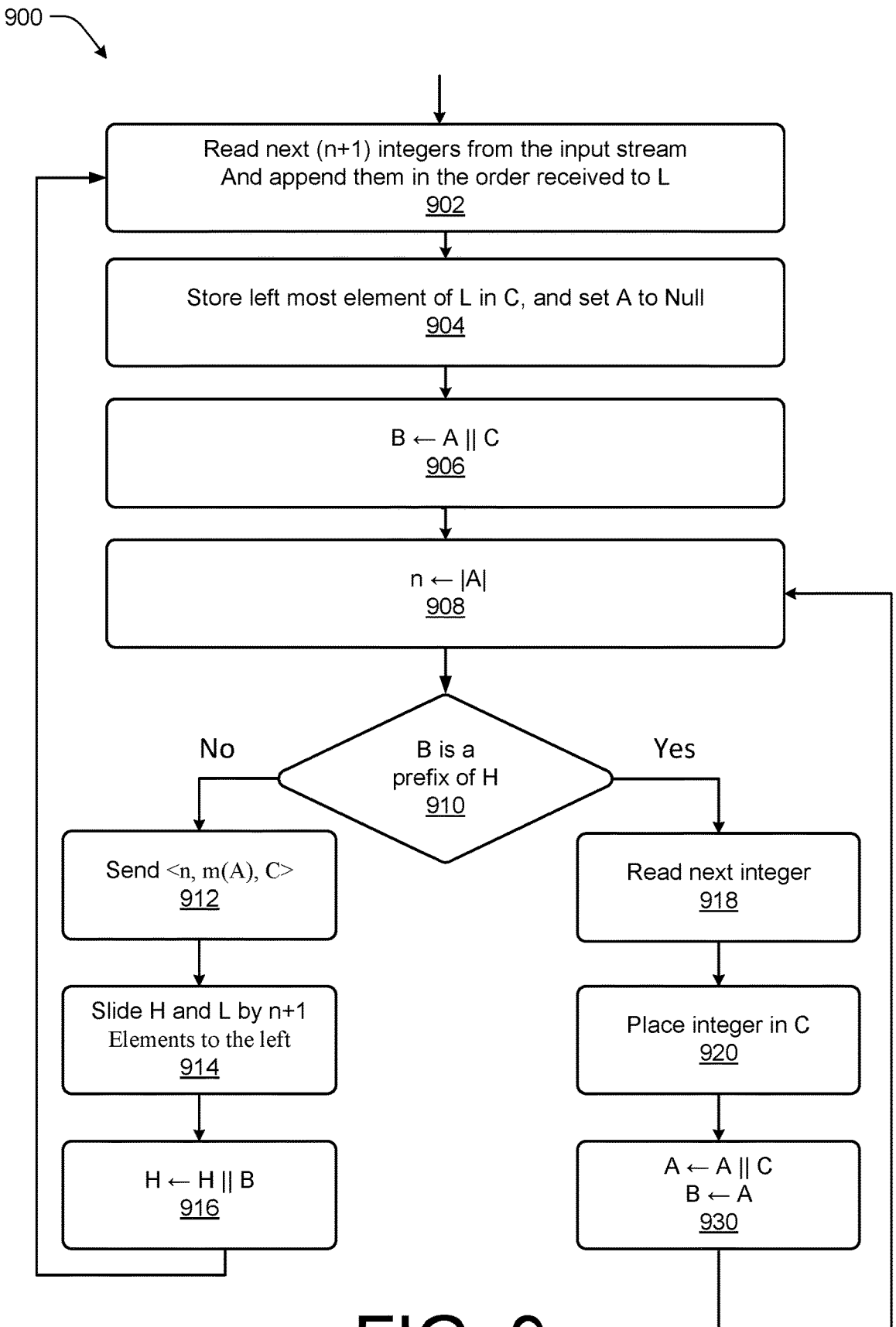
FIG. 9 is example flow diagram showing an illustrative process for encoding an integer according to some implementations.

In this case, the δ-LZ77 history and look ahead buffers contain integers encoded via Elias delta code. Let $\alpha=\{\delta(\alpha_0), \delta(\alpha_1), \ldots, \delta(\alpha_{m-1})\}$, be the current contents of the look-ahead buffer and let $\beta=\{\delta(\beta_n), \delta(\beta_{n-1}), \ldots, \delta(\beta_1)\}$ be the current contents of the history buffer. Following the notation of set theory, we refer to mathematical structures such as $\alpha$ as ordered lists of integers. Where the order may be determined by the order of "arrival" into the input stream. The code for the case of no match between a and any substring of the history buffer is the triplet $(0,0, \delta(\alpha))$ (one of this 0 is redundant and can be "reused"). As in the standard algorithm, the triplet for a maximal prefix match between $\gamma \subseteq \alpha$ and a substring of the history buffer, is $(k,l,\delta(\alpha_{next}))$, where k and l denote the location and length of the match and $\delta(\alpha_{next})$ is the code of the first UD encoded integer that follows $\gamma$. Further improvement can be achieved. For example, the indexes k and l can be encoded via VLC and in specific via Elias delta code are, even, via recursive application of δ-LZ77 This discussed in a section referred to as δ-LZi FIG. 9 is an example flow diagram showing an illustrative process 900 for encoding an integer according to some implementations. It should be noted that the buffers, defined above, and referred to in this description, are the encoder's buffers. The decoder maintains separate instances of buffer. The process 900 includes a flowchart of the δ-LZ77 encoding process defined above. We assume the availability of two ordered integer lists: H (this list is the equivalent of the LZ77 history buffer) and L (the equivalent of the LZ77 look-ahead buffer). Additionally, we assume the availability of ordered lists of integers A and B and a single item list C. Initially A, L, and H are empty. Finally, we use an integer variable n as a match counter. In 902 the encoder reads the next (n+1) integers from the input stream and appends them in the order that they have been read to L. In 904 the encoder stores the "left most" element of L in C and sets A to Null (i.e., to the empty list). In 906 the encoder generates the list B=A||C('||' denotes ordered list concatenation operation). In 908 the encoder sets n to |A| (|A| denotes the cardinality of A). In 910 the encoder checks if B is the prefix sub list of any subsist of the history buffer list H. If B is not the prefix subsist of the history buffer list H, then in 912 the encoder sends, to the decoder, the code <n, m(A), C>. Where m(A) is the location of the maximal prefix match of A with H (in some embodiments m(A) may be set to 0 for the case of no match). Next, in 914 the encoder slides H and L by n+1 element to the left. In 916 the encoder appends B to H. Next, the encoder goes to 902. If B is the prefix subsist of the history buffer list H, then in 918 the encoder reads the next integer from the input list. In 920 the encoder places this integer in C, updates A to be A=A∥C, and sets B to B=A. Next, the encoder goes to 908.

Next, we describe an example of a decoder embodiment. A person that is skilled in the art, however, can derive the decoding process described below from the definition of the encoder.

Figure 10:
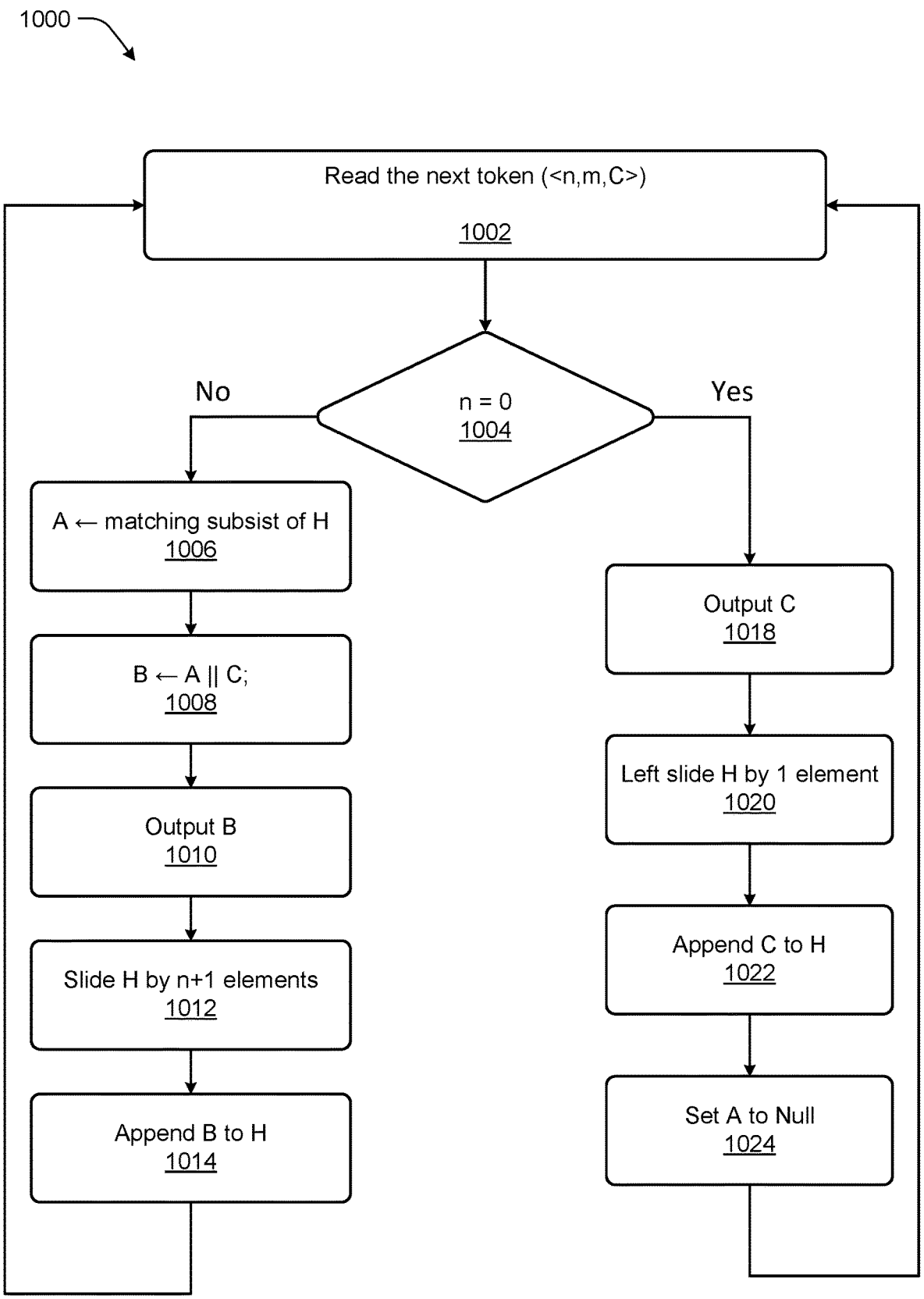
FIG. 10 is example flow diagram showing an illustrative process for decoding an integer according to some implementations.

FIG. 10 is an example flow diagram showing an illustrative process 1000 for decoding an integer according to some implementations. It should be noted that the buffer, defined above, and referred to in this description, is the decoder buffer and the encoder maintains a separate set of buffers. The process 1000 includes a flow-chart of the δ-LZ77 decoding of the encoding process defined above. We assume the availability of an ordered integer list: H (this list is the equivalent of the LZ77 history buffer). Additionally, we assume the availability of ordered lists of integers A and B and a single item list C. Finally, we assume the availability of two counters n and m; both counters are initialized to 0. Initially A, and H are empty. In 1002 the decoder reads the next token of the form of <n, m(A), C)> from the input stream. In 1004 the decoder checks if n=0. If n=0 then the decoder outputs C (1018), slides H by one element to the left (1020), appends C to H (1022), sets A to be an empty ordered list, that is sets A to Null (1024), and goes 1002. If n≠0 then in 1006 the decoder gets the subsist of H that starts at location m(A) with a length of n and stores it in A. Next in 1008 the decoder set B=A∥C, and outputs B (1010). Next, in 1012 the decoder slides H to the left by n+1 elements to the left (1012) and appends B to H (1014). Finally, the decoder sets A to be an empty ordered list. Next, the decoder goes to 1002.

LZ78 Compression of Unbounded Integers (δ-LZ78)

The LZ78 algorithm is a dynamic lossless data compression algorithm developed by Lempel and Ziv and described in detail in their 1978 paper. In a way, the algorithm manages the LZ77 history buffer in a table (dictionary). As in many dynamic data compression algorithms the encoder and the decoder work in tandem where the decoder can reconstruct the history buffer and infer the current input (parts of the encoder look ahead). Theoretically, the algorithm is universal. Practically, in many cases it provides competitive compression ratio often better than the LZ77. The hardware implementation of this algorithm, however, is more complicated than the LZ77 possible hardware implementations. Numerous variants and improvements of the LZ78 have been developed; the most notable is the LZW which is described below. The method described here (δ-LZ78) is applicable to many of the variants and improvements.

δ-LZ78 Compression of Unbounded Integers

The δ-LZ78 dictionary contains sequences of integers where each integer is encoded via Elias delta code. The table entries include the matches encountered so far (the entries indexes can be encoded using Elias delta code). The dictionary update and the code transmission procedures comply with the standard LZ78 procedure. However, in lieu of using the fixed length code (FLC) of an alphabet characters, a VLC, namely the Elias delta code of integers, can used. For the VLC case we can use the following strategy: The code for a matching sequence is: (δ(i), δ(j)), where the index of the longest match is i and j is the first non-matching integer. The code for a non-matching singleton j is: (0, δ(j)). This is further discussed later in this application.

Figure 11:
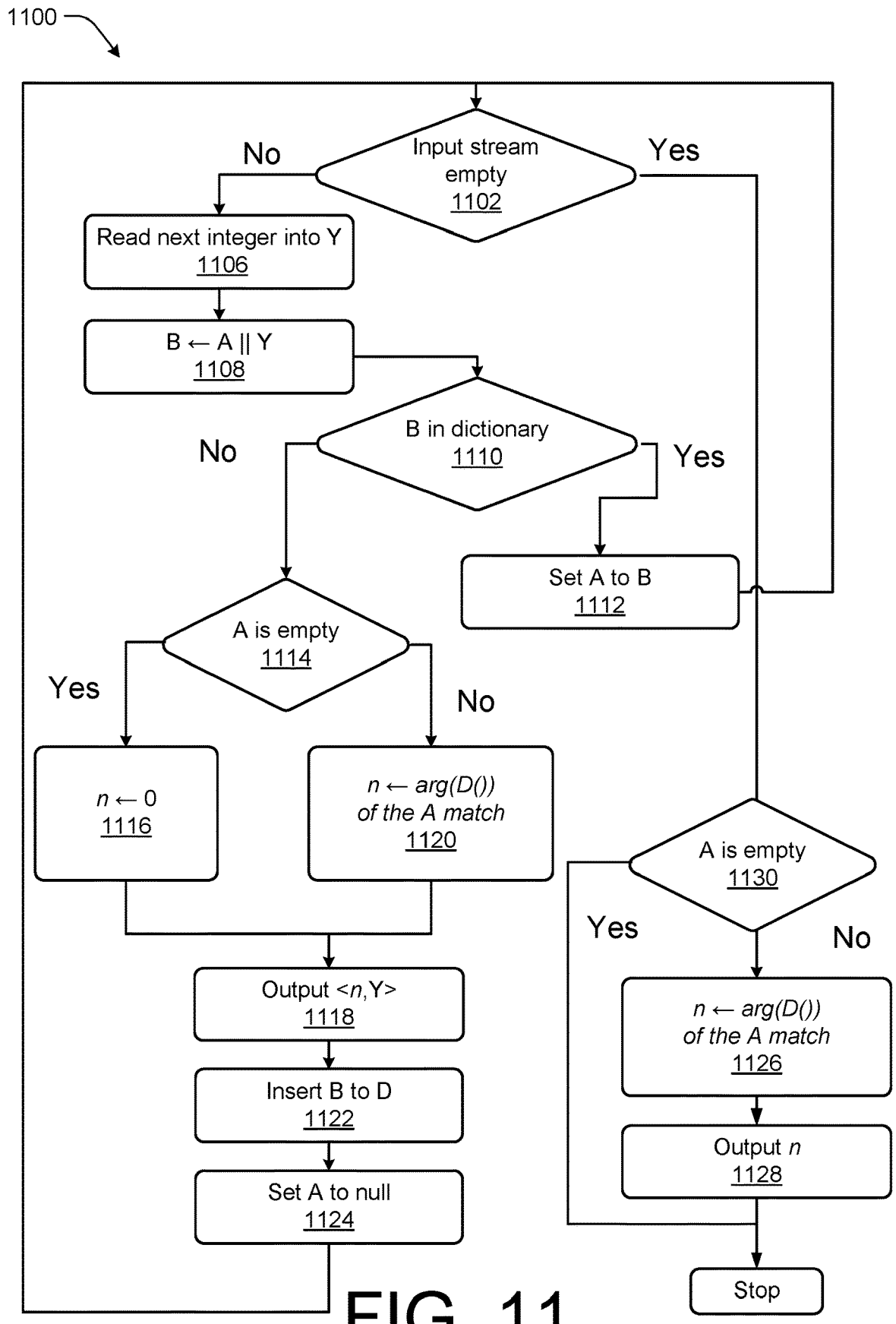
FIG. 11 is example flow diagram showing an illustrative process for encoding an integer according to some implementations.

FIG. 11 is an example flow diagram showing an illustrative process 1100 for encoding an integer according to some implementations. It should be noted that the dictionaries, and lists defined above, and referred to in this description, are the encoder's lists and dictionaries and the decoder maintains separate instances of these items. The process 1100 includes a flowchart of the δ-LZ78 encoding process defined above. We assume the availability the availability of two ordered lists of integers A and B and a single item list Y. The encoder dictionary (D) is a list of items of the same form as the ordered list A. Initially A and D are empty. Finally, we use an integer variable n as a match counter. In 1102 the encoder checks if the input stream is empty. If the stream is empty, then the encoder moves to 1130. If the stream is not empty, then in 1106 the encoder reads the next integer (say a) from the input stream and stores it in Y. In 1108 the encoder sets B to A∥Y(∥ denotes ordered list concatenation operation). In 1110 the decoder checks if B is in the dictionary D. If B is in D, then in 1112 the encoder sets A to B and goes to 1102. If B is not in D, then in 1114 the encoder checks if A is empty. If A is Empty, then in 1116 the encoder sets n to 0 and goes to 1118. Otherwise, in 1120, the encoder sets n to be the index of the dictionary entry that matches A and goes to 1118. To clarify, the notation used in flow chart to denote the operation performed in 1120 is: n←'arg(D( )) of the A match'. In 1118 the decoder outputs <n, Y>. Next in 1122 the encoder inserts B to the dictionary D. Next, the encoder sets A to null and Goes to 1102. In 1130 the encoder checks if A is empty. If A is not empty, then in 1132 the encoder sets n to be the index of the dictionary entry that matches A. And in 1134 the encoder outputs n.

Next, we describe an example of a decoder embodiment. A person that is skilled in the art, however, can derive the decoding process described below from the definition of the encoder.

Figure 12:
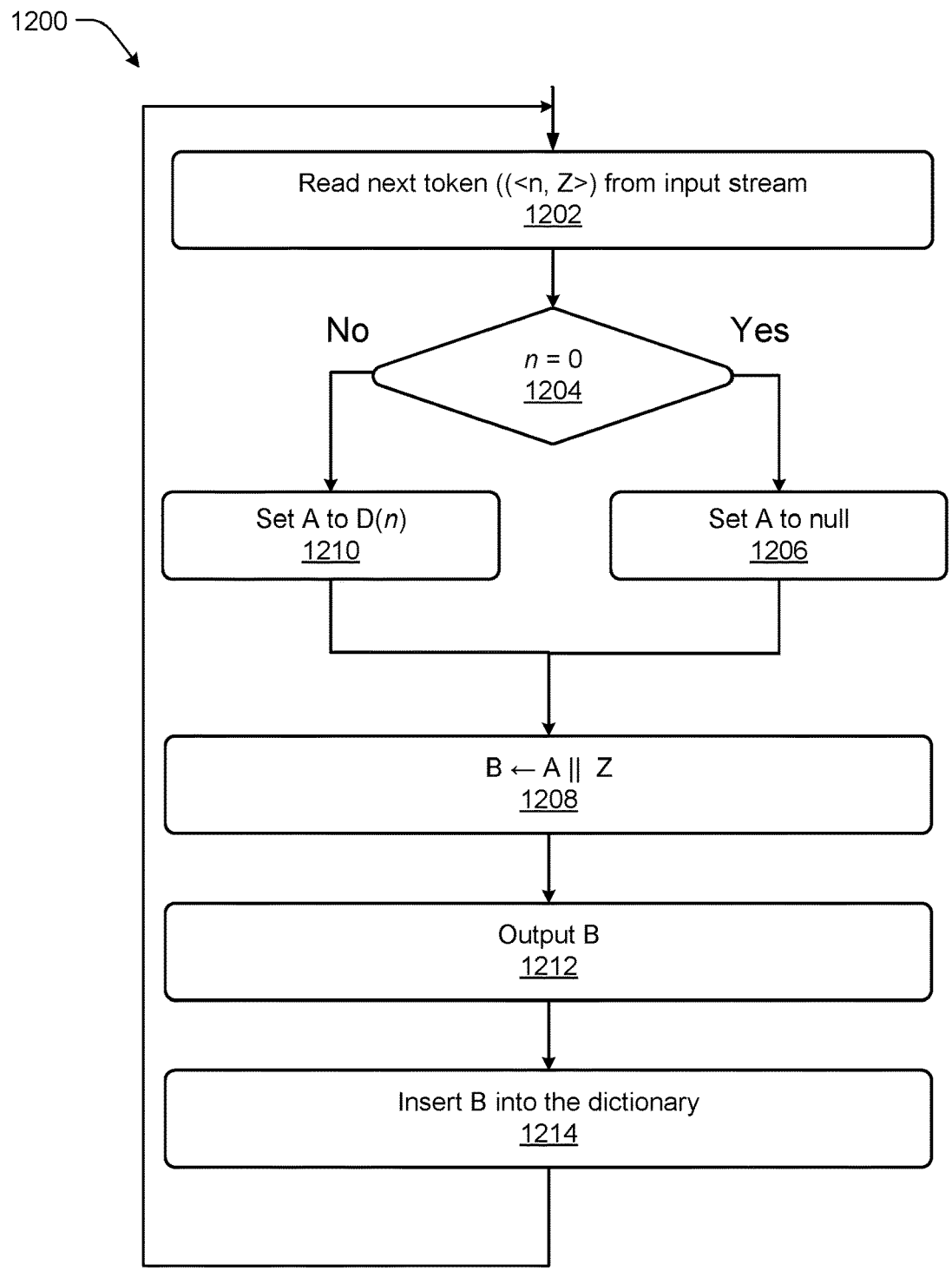
FIG. 12 is example flow diagram showing an illustrative process for decoding an integer according to some implementations.

FIG. 12 is an example flow diagram showing an illustrative process 1200 for decoding an integer according to some implementations. It should be noted that the dictionaries, and lists defined above, and referred to in this description, are the decoder's lists and dictionaries and the decoder maintains separate instances of these items. The process 1200 includes a flow-chart of the δ-LZ78 decoding process defined above. We assume the availability of ordered lists of integers A and B, and a single element list Z. The decoder dictionary (D) is a list of items of the same form as the ordered integer list A. Initially A and D are empty. In 1202 the decoder reads the next token from the input stream. The token has the form <n, Z> where, n is an integer denoting an index, and Z denotes an integer from the encoder input stream. In 1204 the decoder checks if n=0. If n=0 then in 1206 A is set to null. And the decoder moves to 1208. If n≠0 then in 1210 A is set to D(n) and moves to 1208. In 1210 B is set to B=A∥Z (∥ denotes ordered list concatenation operation). In 1212 the decoder outputs B. In 1214 the decoder inserts B to the dictionary.

Lempel Ziv Welch (LZW) Compression of Unbounded Integers (δ-LZW)

Welch has proposed a variant of LZ78, described above, which aimed at solving a deficiency in the original LZ78 algorithm. The main difference is that rather than sending the code <0,'s'> which denotes the first encounter with the symbol s ('s' is the FLC of 's'), the encore dictionary as well as the decoder dictionary are initialized to contain all the alphabet symbols. This can increase the compression ratio and simplify hardware and software implementations. Hence, the LZW variant is a widely used LZ78 variant. Serval variants and improvements of the LZW have been developed. Nevertheless, the method described here (δ-LZW) is applicable to many of the variants and improvements.

δ-LZW Compression of Unbounded Integers

The methods, for unbounded integer compression, described so far, e.g., using flags to denote first encounter with an integer, can be applied to the LZW coding procedure and provides a novel method for extending LZW for use with unbounded integers. The LZW approach however introduces a specific challenge since it requires to initialize the dictionary with the entire set of integers. We propose a few ways to overcome this challenge and exemplify one of these methods.

The example for construction and transmission procedures follow the standard LZW algorithm with the following differences:

1. The LZW dictionary is split into two dictionaries:
    i. A fixed virtual dictionary F which contains all the natural numbers in their natural order.
    ii. A dynamic dictionary D, which contains lists of ordered integers encoded using Elias delta code, is constructed at run time.
2. A flag is used to distinguish between elements of F and D. Hence the longest match is encoded as <0, δ(i(F))> or as <1, i(D) >, according to the match location. The term i(X) denotes the index of the location of a match in dictionary X. The term i(D) can be encoded using Fixed length code (FLC) or Variable length code (VLC). It should be noted that the algorithm described in the example uses a list referred to as the singleton list this is an optional list that can be used to improve throughput.

Figure 13:
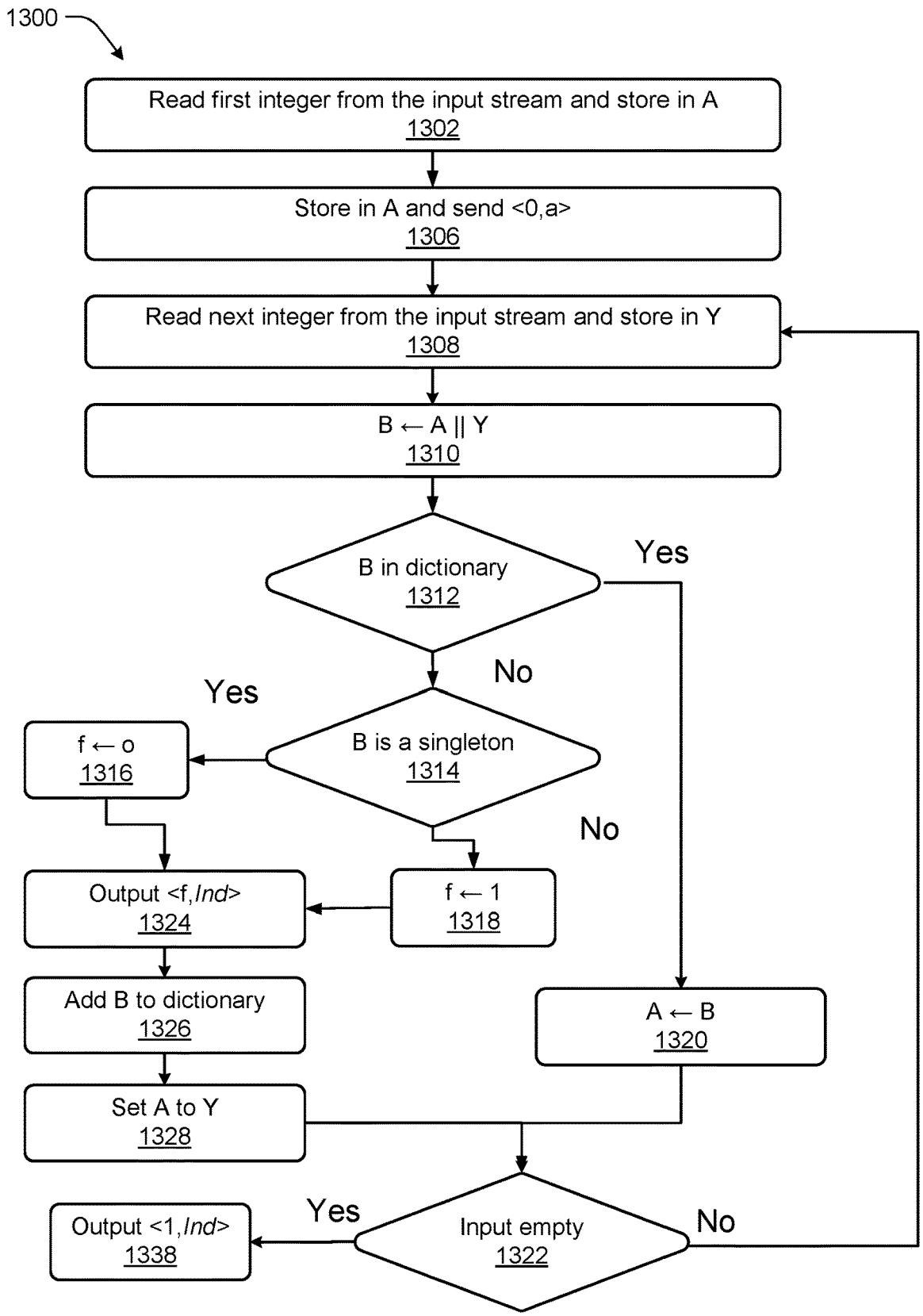
FIG. 13 is example flow diagram showing an illustrative process for encoding an integer according to some implementations.

FIG. 13 is an example flow diagram showing an illustrative process 1300 for encoding an integer according to some implementations. It should be noted that the dictionaries, and lists defined above, and referred to in this description, are the encoder's lists and dictionaries and the decoder maintains separate instances of these items. The process 1300 includes a flow-chart of the δ-LZW encoding process defined above. We assume the availability the availability of two ordered lists of integers A and B and single item lists X and Y. The encoder dictionary (D) is a list of items of the same form as the ordered list A. Initially A and D are empty. Finally, we use an integer variable n as a match counter. In 1302 the encoder reads the first integer (say e) from the input stream and stores it in A. In 1306 the encoder outputs the token <1, e > and stores e in A. In 1308 the encoder reads the next integer from the input stream and stores it in Y. In 1310, the encoder sets B=A∥Y (where ∥ denotes ordered integer list concatenation operation) and, in 1312, checks if B is in the dictionary D. If B is not in D, then in 1316 and 1318 f is being set to either 0 or 1 depending on the whether B is a singleton (1316) or not (1318). In both cases the flow continues to 1324 where the output is <f, Ind> where Ind is the index of the dictionary entry that matches A in D. In 1326, the encoder adds an entry for B in D. In 1328 the encoder sets A to Y and moves to 1322. In 1322 the encoder checks if the input stream is empty. If the stream is not empty, then the encoder goes back to 1308. If the input is empty, then in 1338 the encoder outputs <1, Ind>, where Ind is the index of the dictionary entry that matches A in D.

To further elaborate consider a byte input and a dictionary with 512 entries. In this case the first 256 entries represent the 256 unsigned char values, their index of 9 bits has an MSB of 0. The next 256 are "real" dictionary entries and the MSB of their entry index is 1. A similar approach is used here. However, the first part of the table is virtual and the second is a physical entity. The MSB of index representation denoted whether the entry is virtual or real. Theoretically, the symbols of the alphabet (the 256 unsigned chars) could have been "virtually" placed in the even entries and the real entries would reside in odd addresses. In this case the LSB of the entry distinguishes between real and virtual entry and can serve as a postfix flag. This approach can be adapted for the unbounded integer compression case.

Next, we describe an example of a decoder embodiment. A person that is skilled in the art, however, can derive the decoding process described below from the definition of the encoder.

Figure 14:
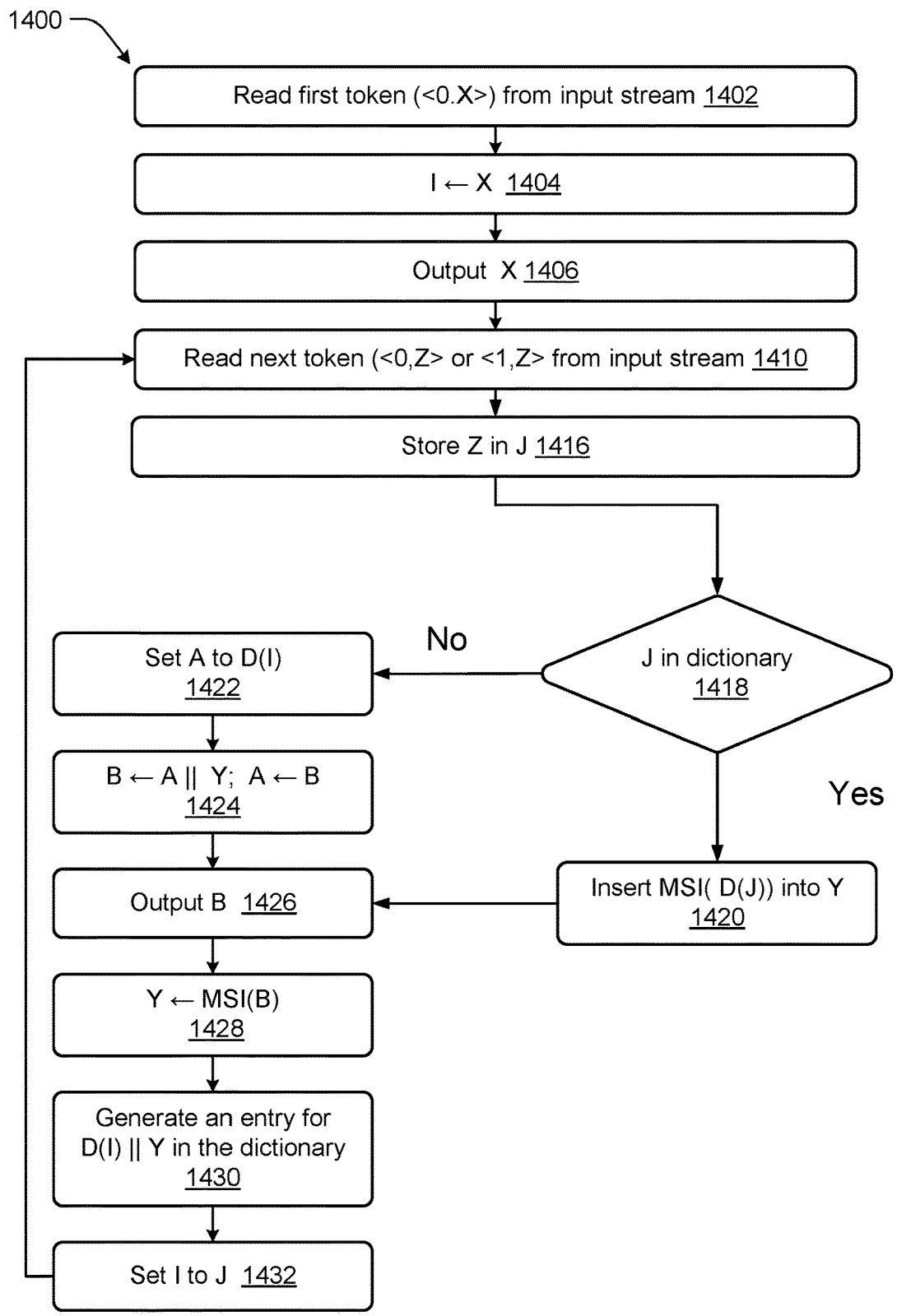
FIG. 14 is example flow diagram showing an illustrative process for decoding an integer according to some implementations.

FIG. 14 is an example flow diagram showing an illustrative process 1400 for decoding an integer according to some implementations. It should be noted that the dictionaries, and lists defined above, and referred to in this description, are the decoder's lists and dictionaries and the decoder maintains separate instances of these items. The process 1400 includes a flow-chart of the δ-LZW decoding process defined above.

We assume the availability the availability of two ordered lists of integers A and B and single item lists X and Y. The encoder dictionary (D) is a list of items of the same form as the ordered list A. Initially A and D are empty. In 1402, the decoder reads the first token (<0, X >) from the input stream. In 1404 the decoder stores X in the integer I. In 1406 the decoder outputs X. In 1410, the decoder reads the next token from the input stream. In 1416, the token is stored in the integer J. In 1418, the decoder checks if the entry J exists in the dictionary. If the entry for J is in the dictionary; then, in 1420, the decoder inserts the contents of the most significant integer (MSI) of J to Y and goes to 1426. If the entry for J is not in the dictionary, then in 1422 the decoder sets A to D(I), the contents of entry I. Next, in 1424 the decoder set B to B=A∥Y and sets A to B. Next the decoder goes to 1426. In 1426 the decoder outputs B. In 1428 the decoder enters the MSI of B into Y. In 1430 the decoder inserts an entry with the contents of D(I)∥Y to the Dictionary. In 1432 the decoder sets I to J and goes back to 1410.

Variable Length Coding of LZ indexes (δ-LZi)

In this section we show a method of improving classical algorithms using the concepts laid up so far. In essence, the method can be used with many compression methods that are employing dynamic dictionary (or tables/buffers) as a part of the compression. For exemplary purposes, this discussion concentrates on the LZ family of algorithms.

Using Integer Coding for Indexes in LZ Compression Methods

LZ77, LZ78, LZW and many other LZ-algorithm-based compression variants use a dictionary (and/or buffers) that are stored in a data structure (DS) such as an array. We refer to this DS as "the table." The LZ77 and LZ78 papers are not concerned with the table size and with the actual implementation of the table. On the other hand, practical applications of LZ algorithms can significantly differ in computational complexity and compression ratio based on the implementation of the table.

Generally, the implementation allows the table to grow and it doubles the table size to $2^{k+1}$ whenever it reaches the boundary of $2^k$ (provided that k is smaller than some given threshold). Hence, generally, the indexes are encoded using FLC. VLC, generally in the form of static Huffman code or static arithmetic code, have been considered. However, this requires prior knowledge related to the probability of getting specific indexes. Furthermore, the indexes must be bounded.

Consider the case where the indexes are not bounded and/or their probability distribution function is unknown. In this case, integer coding technique such as Elias Delta code can be used to code the table indexes. Furthermore, judging from the way that the indexes evolve, it is evident that there might be a strong spatial and/or temporal locality in the table accesses patterns. Hence, using integer coding on the differences between consecutive accesses to the table is expected to significantly improve the performance of the codec.

Yet another performance improvement can be attained by using the methods proposed in this example to further compress the indexes recursively.

In one example, let $D_0$ be the initial dictionary and let i0 be the initial index. The dictionary is growing in accordance with the algorithm; generally, in one entry per input character. Hence, at stage k in the compression process we have the dictionary $D_k$ and a list of indices encountered so far $\{i_0, i_1, \ldots, i_k\}$. The indices are not necessarily distinct.

At stage k+1, $i_{k+i}$ is generated and transmitted by the encoder. Additionally, the table grows by 1 and $D_{k+1}$ is generated by the encoder and the decoder. We refer to $D_k$ as the $L_1$ (level-one) table. This is similar to the idea of cache levels in the memory hierarchy.

Next, the encoder and decoder can further compress the indexes using any of the methods described in this paper. In specific, they can use the combination of LZ77, LZ78, and LZW along with Delta coding to encode the indexes. The dictionary used can be called an $L_2$ dictionary. The process can continue recursively for several steps.

Example Encoding and/or Decoding Engine

Many compression techniques were developed for the compression of large data sets, such as the contents of files, and in the past their performance was of secondary concern because the processors performing the conventional compression techniques were sufficiently proficient that the compression could happen more or less 'for free' because the disks that stored the files were much slower. Further, a file is frequently accessed 'sequentially'—that is, its contents are read out element by element and used. For ordinary files, there is little need to do the equivalent of 'look at the 815th record in the file', and so the problem of random access to compressed data (here, being able to select a specific record in the file) was generally ignored.

However, today this is not acceptable for compressing memory. Consider a program which needs to do matrix multiplication or addition: the data is held in arrays in memory. A value in a row of an array is read by performing a load instruction, with the address of the value used by the instruction. To access the next value in the row, we simply increment the address, arriving at the address of the next value in the row.

If the data is compressed using traditional schemes, however, successive values will likely be compressed by different amounts, and so we cannot access successive values by simply incrementing addresses. In general, to access element 54 in a row, we must start at the beginning of the row, and decompress each element until we arrive at the 54th element. This is prohibitively slow.

Compressing the contents of memory provides a reduction in cost. The present invention combines a compression method with a memory controller and minimizes compression/decompression costs by a combination of three mechanisms.

first, the invention compresses fixed-size amounts of uncompressed memory (say, 4 KB) into multiple smaller blocks (say, 512 bytes) secondly, it holds a working set of recently-accessed decompressed blocks in the DRAM itself and thirdly, it provides a first level tag-only cache in the DRAM controller. The effects are that when an access hits in the tag-only cache, the uncompressed data is read from the DRAM with almost the same latency as an uncompressed DRAM. When there is a miss, then the amount of compression and decompression to be done is limited to a relatively small block of data (we must decompress at most 512 bytes in this example)

To illustrate the problem, when the data in an array is compressed, showing compressed, each row in the array remains a fixed number of bytes (8), but the values in the array are of varying sizes. The values are again shaded grey and white in an alternating manner to make clear their boundaries. The degree of compression will depend in reality on the technique employed and the values involved.

Figure 15:
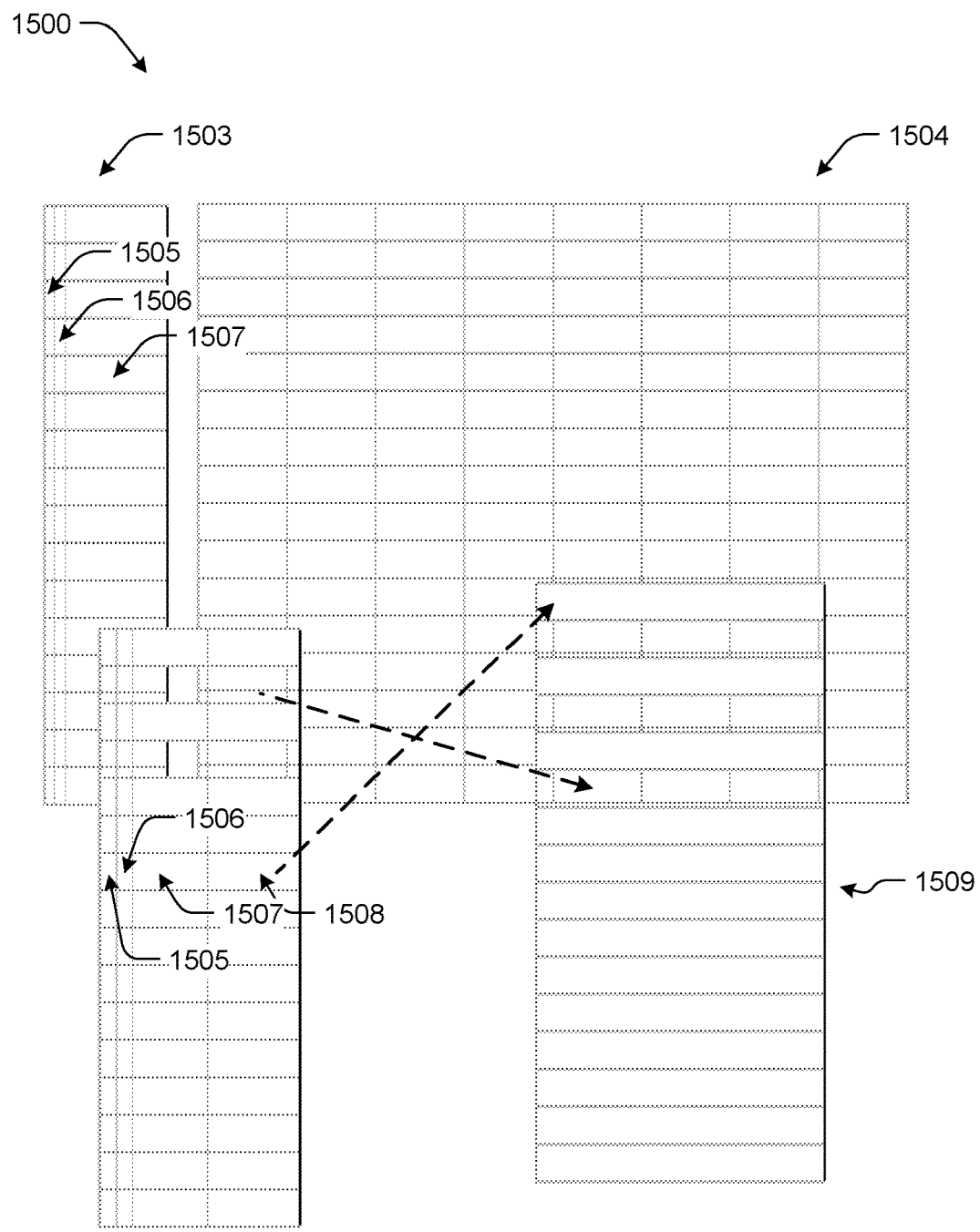
FIG. 15 is an example memory diagram according to some implementations.

FIG. 15 shows a direct-mapped cache. A cache 1500 is a memory structure which can improve a computer processor's performance when that performance is limited by the time taken to access slow main memories. As an example, most programs have around 20% of their instructions reading from memory, and around 10% writing to memory. When a processor reads from memory, it is to get a value that it needs for later use in its computation from memory; it will not be able to perform the computation until the value is obtained from memory because main memory can take of the order of tens to hundreds of nanoseconds to deliver a value requested of the processor. In some cases, a processor may need to wait tens to hundreds of nanoseconds for the value requested. Since the processor may be executing other instructions at one or two instructions per nanosecond, this delay has a substantial effect on performance.

The cache 1500 holds a copy of memory data in a smaller, faster memory. In general, it holds some multiple of fixed-sizes chunks of memory organized as rows of data in a data array 1504. The rows are often 32 or 64 bytes in length.

That data is accessible much more quickly than is the data in main memory—perhaps a nanosecond or so. But being able to access the data quickly is of no use unless the processor has some means of knowing what data is held in the data array. To effect this, the cache keeps a secondary array to hand, conventionally called the tag array 1503.

This array contains the same number of rows as the data array, but each entry is much smaller. Each entry contains one bit conventionally called valid, or V 1505; one bit conventionally called Dirty, or D 106, and a number of bits conventionally called the tag 1507.

The tag contains a representation of the address in main memory from which the row of data in the corresponding row in the data array was obtained. If the data array row length is 64 bytes, and the memory is byte-addressable, then the tag can be 6 bits shorter than the number of bits necessary to hold a complete address. But further, if the data array has say 1024 rows—where 1024 is two to the tenth power—then we can remove another ten bits from the needed length of the tag; so now we can have (with these parameters) just 16 bit tags.

In operation, the processor executes a memory-accessing operation. Suppose that this is a read of address 2040, The address is given to the cache (which for this example has 1024 rows of 64 bytes). the processor first shifts the address right six places. This leaves an address which can select chunks of 64 bytes. Then the cache extracts the bottom ten bits of the remaining bits of the address, and uses these to select one of the rows of the tag array. The processor then looks at the tag array entry.

If the V bit 1505 is set, then the tag holds a valid address. The cache 1500 therefore compares the 16 bits remaining of the address with the value in the tag. If they are the same, then the corresponding row in the data array holds a copy of the data from main memory which surrounds the data requested. This situation is conventionally called a "hit".

The 6 bits removed in the first stage of the cache operation select the byte in the row. The requested data may then be read from the row and provided to the system.

If the tag did not match, or the V bit 1505 is zero, then the data is still in main memory. This situation is known as a "miss". The cache 1500 sets the V bit 1505 of this row to zero, meaning the data is not valid, and requests 64 bytes of data from memory starting at the shifted address (the address with the least significant 6 bits set to zero). Eventually, that data is provided by the memory, and the cache writes the 64 bytes into the corresponding data row; updates the tag value; and sets the V bit 1505 to one. The requested data may then be provided to the system.

Depending on the design of the cache, other accesses may have been serviced while the data was provided by the memory. If this is done, other information will be required in the tag—such as a P bit (pending) indicating when set that there is already an operation to update this row and so no more should be started.

Finally, if the access was a write to memory, the row is computed as before, and if a hit the D bit 1506 is set. This bit is used when we have encountered a situation where the row is Valid but the tag does not match; we then need to replace the data in the data array as described above. But if the D bit 1506 is set, the data in the data array is different from that in main memory, and so must first be written back to memory before it is replaced by data from a different address.

While the cache 1500 is usual to implement the tag array and the data array side by side, there is no reason to do so. If instead of the data array, we add one more field to the tag array, then we can use our tag array to hold information about data held more or less anywhere.

In the current example, the cache 1500 is a 'tag-separated' cache 1500. The tag array 1503 is separate from the data array 1504. Each entry in the tag array X03 is as before. But the data array 1504 contains pointers 1508 rather than data copied from memory. The pointers for each tag point X08 to (hold the address of) the data referenced by the tag 1507. Because of the use of the pointer, the data rows can be anywhere in a memory system.

In one example, the processor may compresses main memory by compressing relatively large portions of the memory—4 KB in the example description. Each such chunk is compressed into a number of smaller blocks. Each block is exactly the same size. In the example description we use 512 byte blocks.

As a chunk of memory is compressed, a sequence of blocks 1534 is obtained from a pool of blocks and the chunk compressed into it until the block is full; at that moment, a next block is acquired and the compression continued until the chunk is completely compressed into the blocks. All the blocks used will be full of compressed data, except the last one.

When a compressed chunk has been decompressed, the processor may be broken up into 8 512-byte blocks and these added to the pool of available blocks.

These operations of managing a pool of blocks, adding compressed chunks as blocks to the pool, and compressing a chunk (and, later, decompressing blocks into a decompressed buffer) are all managed by the compression subsystem, whose detailed operation will be outlined later.

Figure 16:
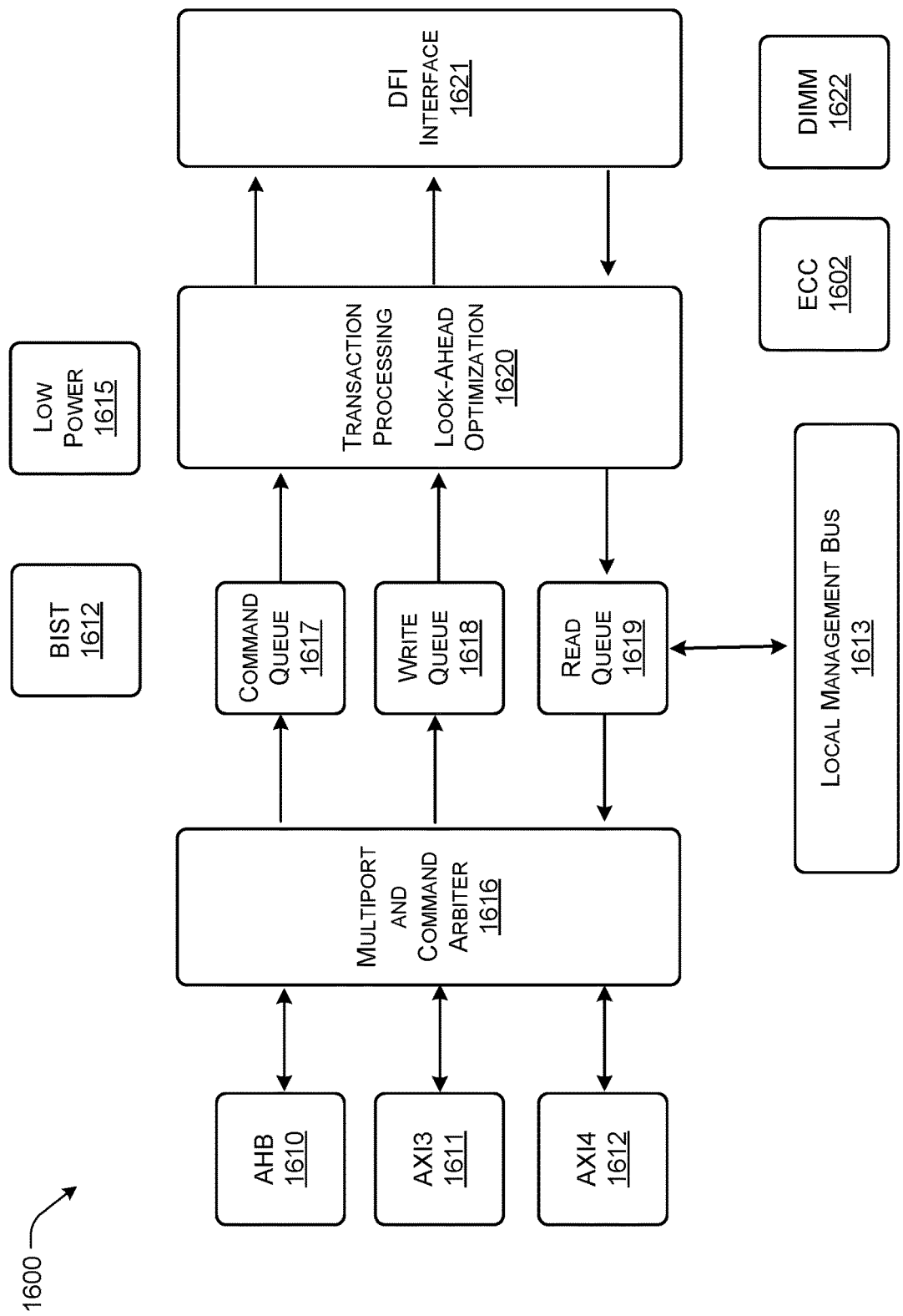
FIG. 16 is an example block diagram of an encoder and decoder according to some implementations.

Consider FIG. 16, which depicts a commercial DRAM controller design in block diagram form. Memory access requests arrive at the left hand side of the diagram on multiple buses (1610, 1611, and 1612), and are captured by the block Multiport and Command Arbiter 6116. This block selects a bus and reads a command from it, and then inserts the command into the Command Queue 6117. If the command selected is a write, then there will be data to be written; this is written into the Write Queue 6118. Commands are taken from the Command Queue 6117 by the block marked Dram Transaction Processing and Optimization 1620; this will re-arrange the order of commands when possible to minimize overall latency, and will then present the commands as transactions on the DFI Interface 1621, which connects to the DRAM system including one or more DRAM Modules (DIMMs 1622) While the DFI interface is an interface which provides detailed control of the DRAM, including refresh operations, its usage as if it simply presented read and write transactions to the DRAM.

In the case of a read presented on the DFI bus, the DRAM 1622 will perform a read, providing a result either form an internal buffer (if the address requested has already been buffered) of form the DRAM array itself. This data is presented back to the block Dram Transaction Processing and Optimization 1620 which will insert it into the Read Queue 1638.

As data becomes available in the Read Queue 1638, the Interface and Command Arbiter 116 will match it up to a received read request, and manage the process of placing the data in the appropriate form onto the bus (1610, 1611, or 1612) that requested the read.

Write requests are treated similarly, except that the transaction presented on the DFI interface 1621 is a write, and includes the data from the Write Queue 1618 to be written into the DRAM 1622.

Figure 17:
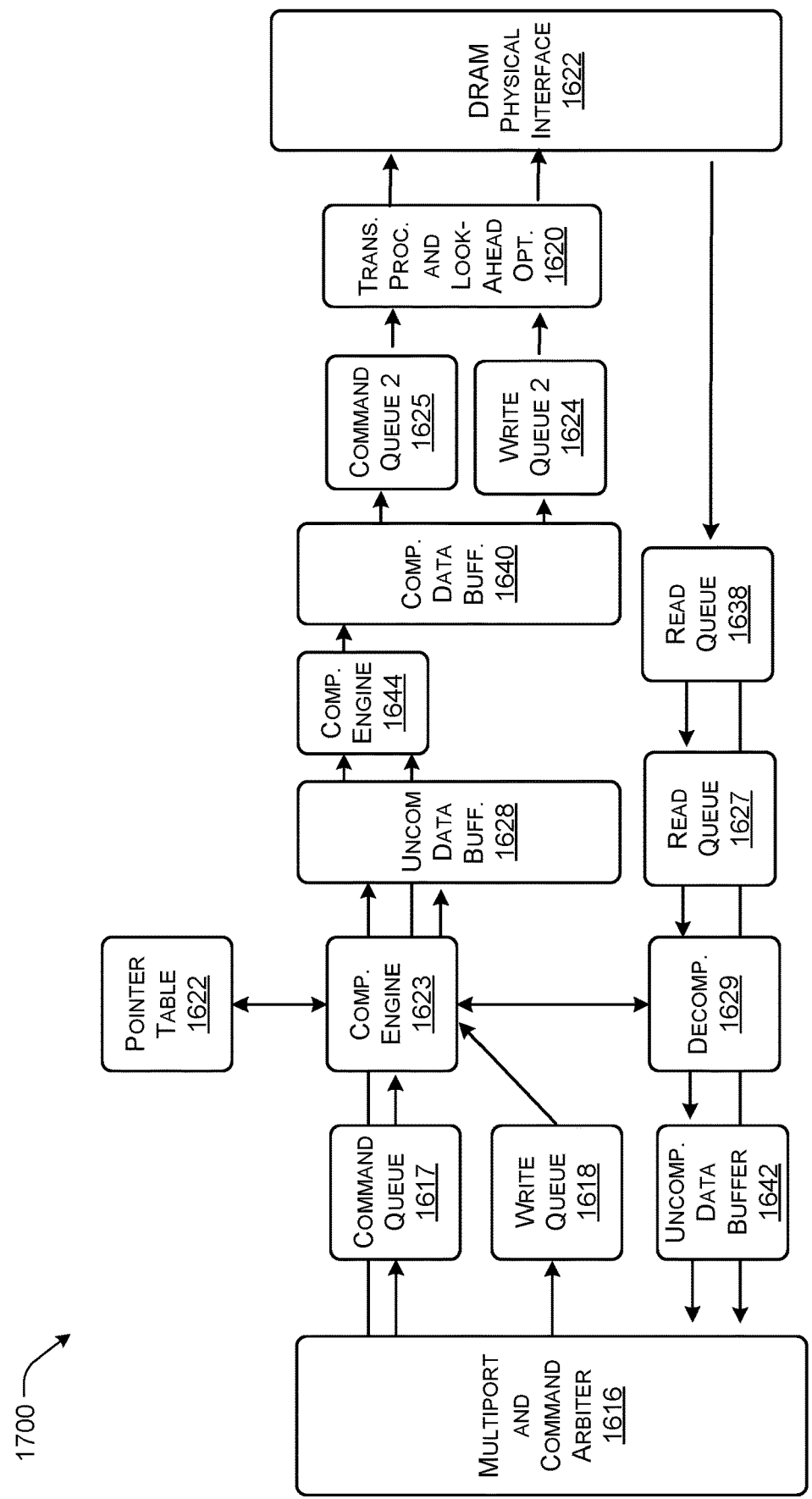
FIG. 17 is another example block diagram of an encoder and decoder according to some implementations.

FIG. 17 represents in block diagram form the same DRAM controller enhanced by the present invention's compression subsystem. The new portions of the system are depicted in grey. Like portions are numbered as in FIG. 16.

The flow is very similar. Let us assume that all data is to be compressed, to keep the explanation simple. Then in the Enhanced DRAM controller transactions entering from the left are dealt with as before; with transactions being placed into the Command Queue 1617 and the Write Queue 1618 as before.

Generally, write transactions are for less than 512 bytes. To implement a write, we must first obtain the appropriate portion of data, which will involve decompression, then merge our write data into that data, and then recompress.

To implement a read, we must get the compressed data from the DRAM 6122, decompress it, and provide the desired slice back to the system.

Doing this on data direct from the DRAM is fairly complicated and time consuming. The present invention therefore avoids the problem by holding some chunks in a decompressed form in the DRAM itself. Then decompression of a complete chunk (which by definition results in an 4 KB chunk) can be done into chunks taken from a chunk pool. It is known in the art how to manage a pool of fixed size portions of memory, perhaps by dividing up a large portion of the memory, dividing it into blocks of the desired size, and queuing these blocks up onto a queue. Then to allocate a block, one removes the block at the head of the queue; when processing of a block is finished, it is returned to the queue.

In the simplest embodiment of the present invention, this is what is done. Assume that no chunks have been decompressed, but that there is a pool of 4 KB chunks in the DRAM. A read request comes in, and the chunk corresponding to that address is decompressed into a chunk obtained from the pool of chunks.

To keep track of which chunks are decompressed, and which compresses, and where they are in the DRAM system, we use the Pointer Table 1632. This is a tag-separated direct-mapped cache, as discussed before. It contains some number of entries. The incoming address is looked up in the Pointer Table 1632, and if a hit is obtained, the tag indicates where the chunk starts in DRAM and whether it is compressed or uncompressed.

Thus, the Compression Controller 1623 takes a command from the Command Queue 1617, looks up the address in the Pointer Table 1632, and if a hit and uncompressed, computes the address of the data and passes it on directly to the Command Queue 2 1625. It should be noted that at this point, the entry in Command Queue 2 1625 is an ordinary read transaction of the same form as in the un-enhanced DRAM controller. Thus, the same Dram Transaction Processing and Optimization block 1620 performs re-ordering and presentation of requests as before to present the data to the DRAM 1622.

The returning data is taken from an uncompressed chunk, and thus is exactly the same as with the unenhanced DRAM controller. It is made available to the Interface and Command Arbiter 1616 from the Read Queue 1638 as usual for passing back to the rest of the system.

A write whose address hits in the Pointer Table 1632 is dealt with similarly, with the write data and command being forwarded by the Compression Controller 1623 to the Transaction Processing Look-Ahead Optimization block 1620, which writes the data into the decompressed data chunk.

If, however, the lookup in the Pointer Table resulted in a miss, then there is no decompressed data available. Dealing with this is more complex. The data structures involved are depicted in FIG. 17, below. The Pointer Table 1632 is composed of three arrays—the Tags 1607, the Pointers 1633, and the Boundary Pointers 1631. It is a direct-mapped tag-separated cache, and so row N in one array corresponds to row N in the others. Each row corresponds to a data chunk.

The Tag array 1607 is as described before. It contains the usual bits for validity and dirtiness, the tag address and some other bits necessary to manage updating.

The pointer array 1633 contains pointers to the blocks comprising that chunk. One of the new tag bits, C, indicates whether the chunk is compressed or uncompressed. An uncompressed chunk may be represented as either a single 4 KB uncompressed chunk, or a collection of 8, 512 Byte uncompressed blocks. If the representation. A further bit, B, indicates whether the chunks is a collection of blocks. If it is a collection of blocks, the 8 Pointers will point at each one. If it is just one chunk, Pointer0 points at the chunk If the chunk is compressed, there are 8 pointers per row in the pointer array. These point to the blocks containing the compressed data for that chunk. If there are only n such blocks, pointers n, n+1, . . . are set to NULL.

If compressing the chunk leads to an expansion of data size, the chunk is maintained uncompressed. In that case the C bit is zero, and the B bit is zero, and just pointer 0 is used, and points at the uncompressed chunk (which may or may not be at its 'natural' address.)

In one example, a read request is accepted, looked up in the pointer table 1632, and if a hit—that is, the cache contains information for the chunk in question—the whereabouts of the data is computed. If the chunk has been decompressed, then the chunk is either a collection of blocks, or a chunk, as defined by the B bit. In either case, the address of the desired datum is easily computed, and a read request sent on to Command Queue 2 1625.

A write request works the same way, except that the write data travels along the write queues in tandem. But suppose there is a miss—the chunk is not in the Pointer Table 6132. Then the data is still compressed.

The Pointer Table Cache 1832, in some cases, may not economically be made large enough to hold a tag for every chunk in a very large memory system. We therefore provide such a table in the DRAM itself. This is economical. Each row of the table represents 4 KB of memory. Each row contains a few bits, a tag address, and eight pointers. In a 64 bit address system, this is a few bits, plus nine 64 bit addresses—or just about 9*8 bytes, or 72 bytes, which is under 2% of the chunk it is describing.

Figure 18:
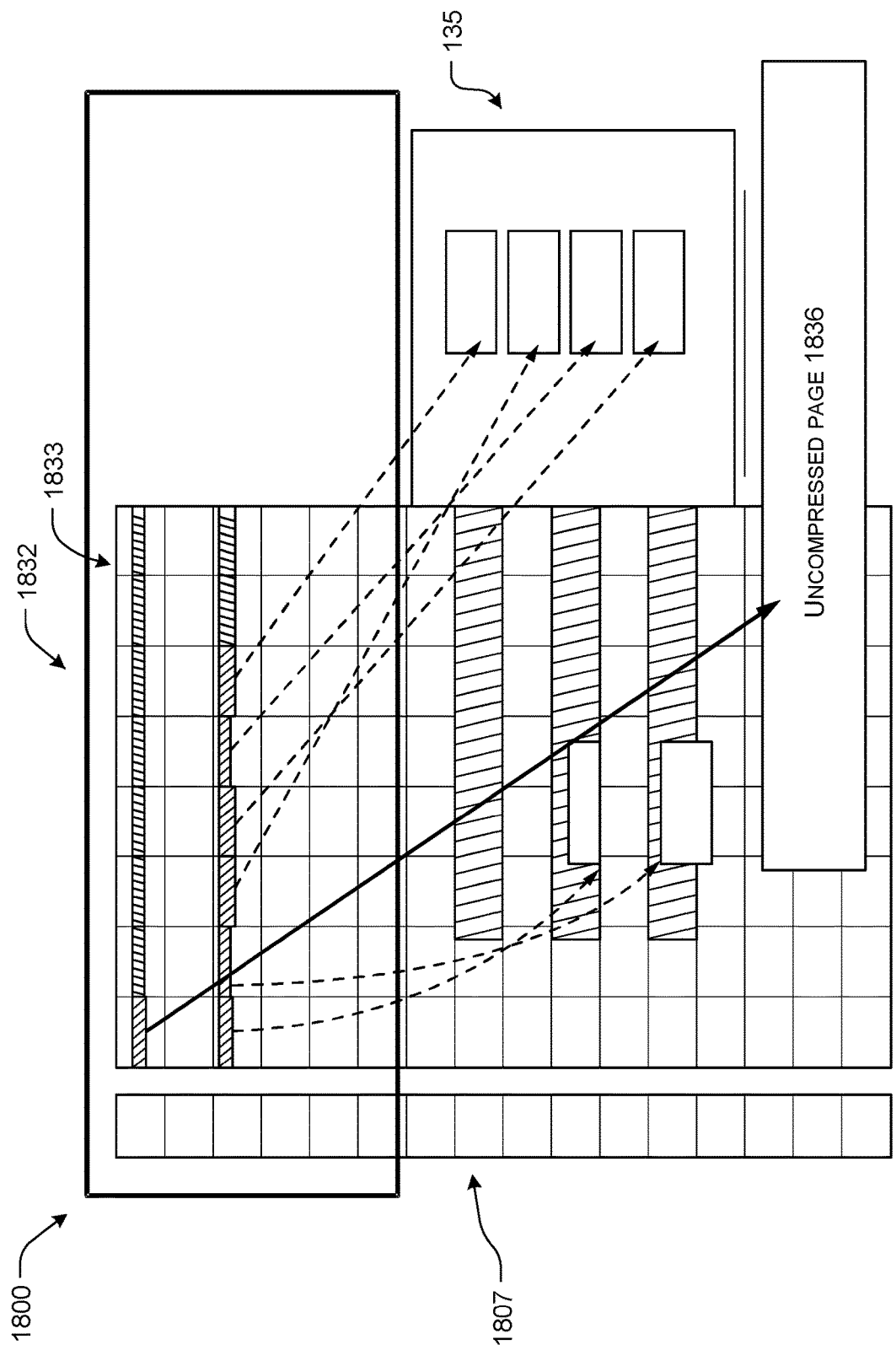
FIG. 18 is an example memory diagram according to some implementations.

While the Pointer Table cache (PTC) 1832 having points 1833 is indeed a tag-separated cache, (illustrated in FIGS. 18 and 19) which therefore does not hold an entry for every chunk, the Main Pointer Table (MPT) in DRAM is a complete map. It has one row for each chunk. In a 64 GB main memory, there are 16 M such chunks, and so the in-DRAM Table will have 16 M rows and occupy around 144 MB. It has the same structure as the Pointer Table Cache in FIG. 19, except that it has no need of the tags 1807 in the tag array—just the control bits V, D etc. but is not a cache, and is held in DRAM. It is illustrated in FIG. 20.

In processing compressed and uncompressed data in the controller, there is a need for staging buffers to hold compressed and uncompressed data. The present invention makes use of four such data buffers:

Compressed Data Buffer 1
Compressed Data Buffer 2
Uncompressed Data Buffer 1
Uncompressed Data Buffer 2

The Uncompressed Data Buffer holds data provided from the system to the present invention via the interface 916. It is also used by the Compression Controller and Engine as a source of data to compress into the Compressed Data Buffer 1, which itself provides the compressed data to the Write Queue 2 which provides the data as a sequence of compressed data items for writing into the DRAM.

The Compressed Data Buffer 2 holds compressed data from the DRAM, staged in the Read Queue, The Decompression Engine will decompress this data under the control of the Decompression Controller to provide uncompressed data to the system, staging that uncompressed data in the Uncompressed Data Buffer 2 or providing it to the Compression Controller so that it can be uncompressed and held in Uncompressed Data Buffer 1, to allow merging new data written to DRAM. Compressed data to be written to the DRAM is created by the Compression Engine (9xy) under the control of the Compression Controller taking data from Uncompressed Data Buffer 1 and compressing it into Compressed Data Buffer 1, In an example, the engine manages a miss in the PTC. The Compression Controller 1623 sees that there is a miss. What it needs to do is to get the data for the address in question and insert it into the PTC, and it needs to decompress the chunk. To decompress the chunk, it will read the relevant row from the MPT 1639 into on-chip buffers, and then decompress each block. Before starting the decompression, the engine must obtain a free chunk from the chunk pool. Now it can read the blocks for this chunk one by one and decompress them. It does this by sending the appropriate sequence of read requests to Command Queue 2 1625, resulting in compressed data arriving in the Read Queue 138. It causes the compressed data to be read into the Compressed Data Buffer 1627, where the controller 1623 causes the Decompressor 1630 to read the data from the Buffer 1627 and decompress it into Uncompressed data Buffer 2 1629, The Controller then causes that data to be written back to the DRAM into the correct place in the uncompressed chunk.

When this is completed, the Controller updates the PTC appropriately and services the request as before. A write works similarly, except that first the chunk is decompressed, and then the write data is written into the decompressed chunk.

The compression of a complete chunk can take some time. With some compression techniques, such as those discussed above, the decompression can be as short as a few cycles for each 64 bytes of data to decompress. The present invention needs to decompress 4 KB, which is 64 decompressions. If the processor requesting the memory read runs at 1 GHz or so, we might expect the DRAM to do a random access in perhaps 100 nsec (as a useful exemplary round number) and successive reads in 10 nsecs per read.

To read the row from the MPT will therefore (at 8 bytes per transfer) take 100 ns+8*10 nsec, or nearly 200 nsec. Then reading 4 KB is actually reading 512 B eight times. Each 512 byte block takes 100 ns for the first read and 10 ns for each of the successive 64 reads, for a total of nearly 800 ns per block and (on average) 4 blocks (if we get 2× compression) for a total time of more than 3 microseconds. The decompressor should be able to keep up with the data rate from the DRAM, and so imposes just a pipeline delay.

3-4 microseconds instead of 100 nsec for a random access is a heavy penalty. The present invention improves on this by performing the equivalent of 'critical word first'. In a normal cached system, with cache lines of 64 bytes, a load instruction may request an 8-byte word which is somewhere in the middle of the line, or even at the end. If the cache controller always does the simple thing, it will read the cache line from memory starting at the address of the cache line. Then, if the required data is at the end of the cache line, the processor will have had to wait for the previous bytes to have been fetched. This can be reduced by performing 'critical word first' fetches from memory. rather than starting from the beginning of the cache line, the cache controller starts with the slice containing the required datum, and fills the cache line, wrapping round at the end of the line. This way, the desired word can be provided with the minimum of delay.

Figure 19:
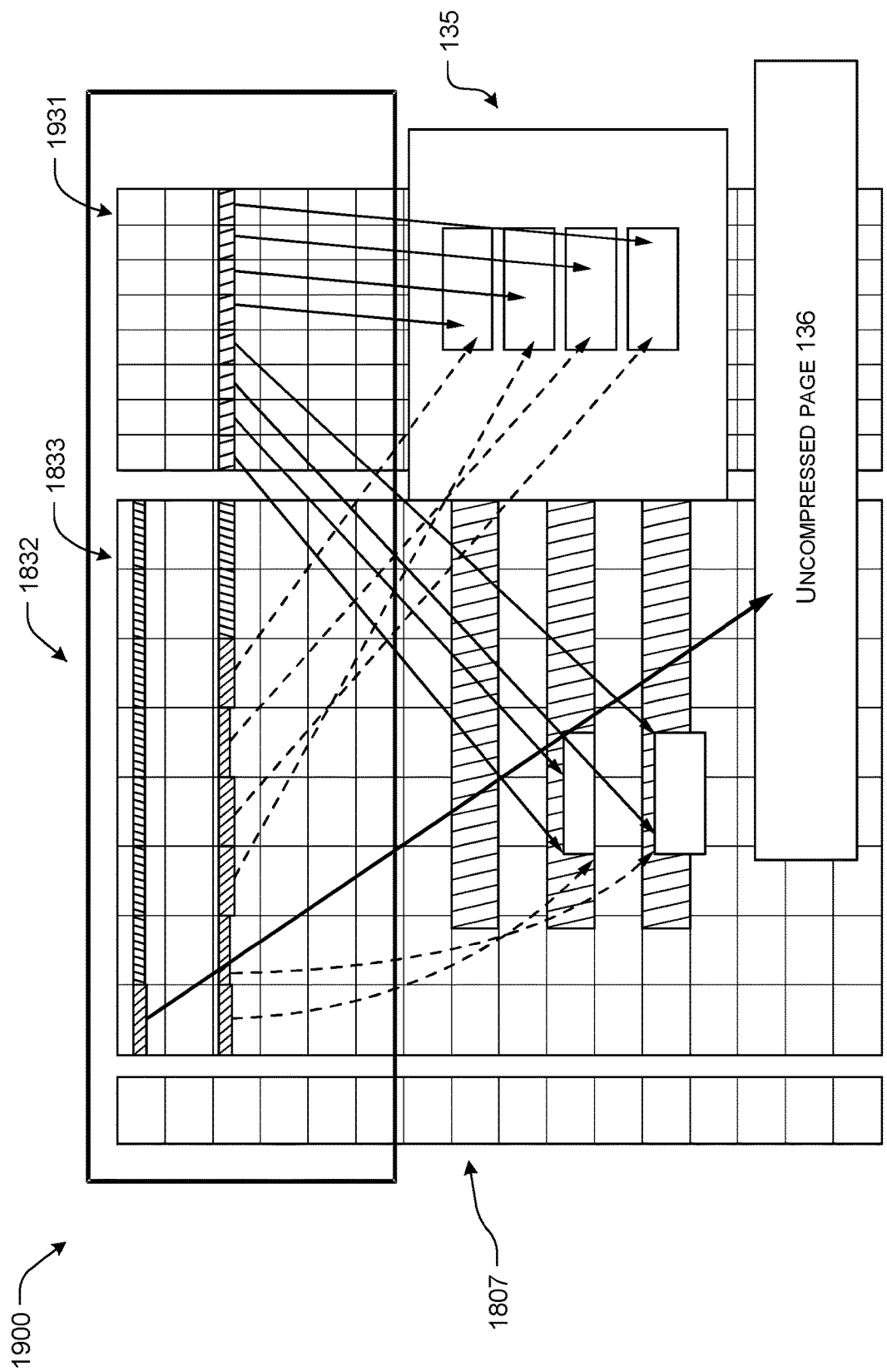
FIG. 19 is an example memory diagram according to some implementations.
Figure 20:
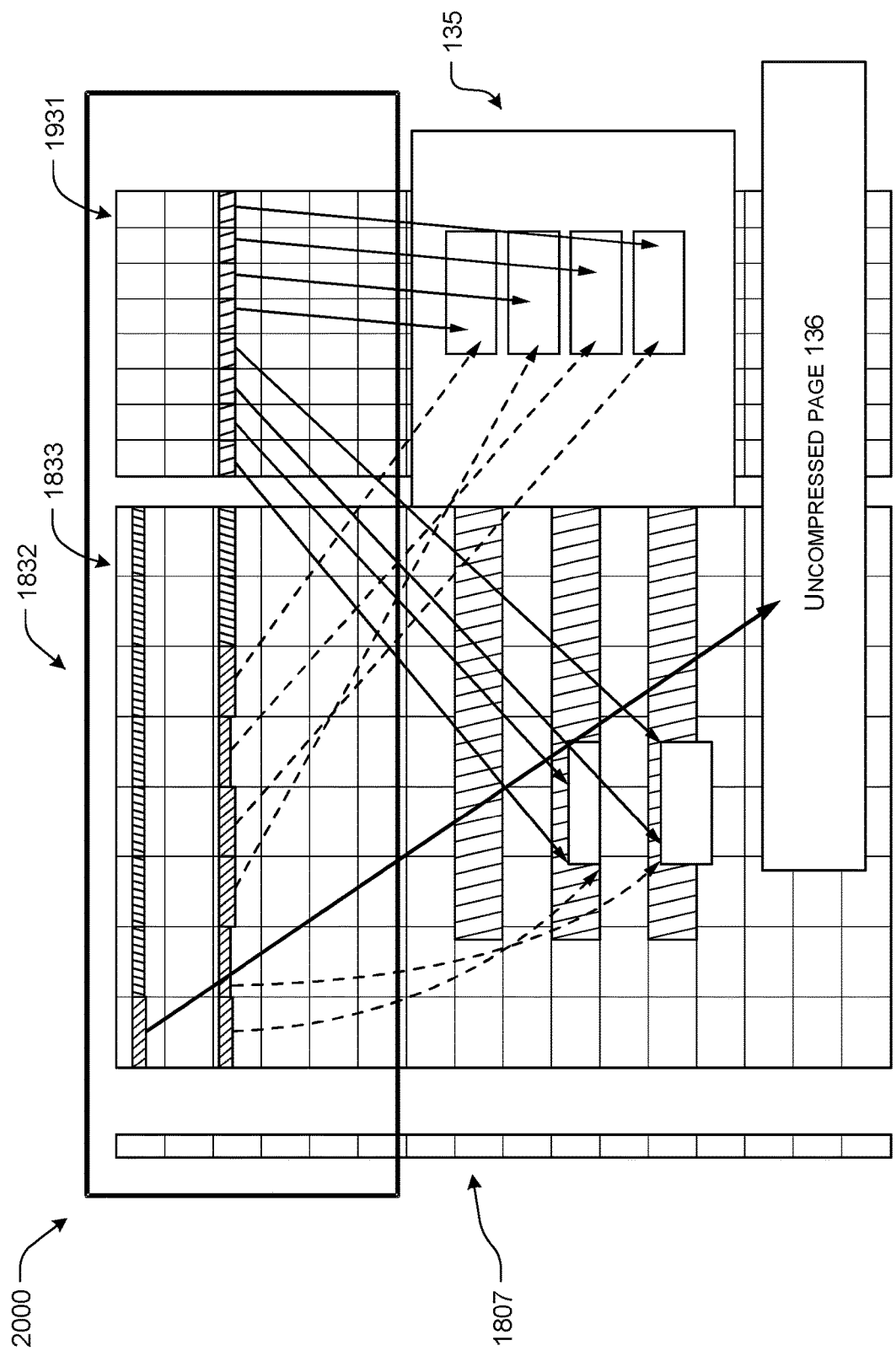
FIG. 20 is an example memory diagram according to some implementations.

To provide this functionality, the present invention provides an extra eight Boundary Pointers 1931 per row in the MPT only, as shown in FIG. 19.

Each chunk is 4 KB. Each Boundary Pointer points into a block containing the chunk's compressed data. BP0 points at the base of block 0. BP1 points at the byte in the block which—uncompressed—had the address 512. Successive Boundary Pointers indicate bytes where the original data had an address which was a multiple of 512. Then given a read address we can index into the Boundary Pointers and find the block containing the required datum. This block may be decompressed first, and the required data provided to the system as before. The rest of the chunk is then decompressed and the information held in the PTC as before. This will reduce the decompression time to the initial MPT lookup followed by one block, or about 1 microsecond, a performance improvement of 4×. In fact, this can also be reduced; the present invention counts the words as it decompresses, and provides the required data when it is encountered. On average, this will happen halfway through the block, and so there will be only 400 nsec decompression time on average. for a total of around 600-700 nsec.

The boundary pointers do not need to be full addresses. They need to specify a block number (three bits) and an offset into it (9 bits). The performance of the present invention in a real system will be strongly affected by the cache hierarchy between the processors and the DRAM.

The description of the preset invention has been at a 'block diagram' level, but its implementation will be straightforward for practitioners competent in the art.

It will be apparent to practitioners how to further improve the performance of the present invention by adding in hit-under-miss behavior, wherein the controller may service hits in the PTC while servicing a miss-provoked decompression. While this will not help the requestor of the transaction that missed, it keeps the latency down for other requesters.

The present invention has been described with all DRAM data being compressed. In some systems, it may be beneficial to compress selectively, and an effective way of doing this is to enhance the system MMU so that a page may be marked 'compressible' or 'uncompressible'. Since in general a memory request arriving at the Controller will have passed through the MMU, it would be straightforward to add a 'compression' bit into the command encoding.

The present invention uses the DRAM for both data and metadata, as well as a pool of blocks for compression and decompression. The configuration of a system embodying the present invention would be done before proper use of the DRAM system begins, by writing commands to the Compressing DRAM controller as is usual. The various data structures including the pools of blocks may be implemented by ordinary program running on a processor with the DRAM controller in a pass-through mode so that transactions occur without compression.

Compressed data is arguably more prone to damage than uncompressed data. Thus, any implementation should also provide strong ECC protection for the DRAM.

The preferred embodiment of the present invention includes the compression controller and compression engines embedded in a DRAM controller as described, with the provision of an on-chip PointerTable cache and in-DRAM Master Pointer Table with Boundary Pointers.

CONCLUSION

Integer compression is essential in numerous systems including communication, multimedia, and data retrieval systems. A new methodology for encoding unbounded integers using current dynamic compression methodology has been presented. We have shown that the proposed dynamic coding schemas of integers are asymptotically optimal. The method introduced in the subsections above discuss various methods for "Dynamic Lossless Compression of Unbounded Integers" that may be used for block compression.

In this patent, certain U.S. patents, U.S. patent applications, and other materials (e.g., articles) have been incorporated by reference. The text of such U.S. patents, U.S. patent applications, and other materials is, however, only incorporated by reference to the extent that no conflict exists between such text and the other statements and drawings set forth herein. In the event of such conflict, then any such conflicting text in such incorporated by reference U.S. patents, U.S. patent applications, and other materials is specifically not incorporated by reference in this patent.

Further modifications and alternative embodiments of various aspects of the invention will be apparent to those skilled in the art in view of this description. Accordingly, this description is to be construed as illustrative only and is for the purpose of teaching those skilled in the art the general manner of carrying out the invention. It is to be understood that the forms of the invention shown and described herein are to be taken as examples of embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A method comprising:
  (A) determining an initial set of a binary representations of the plurality of symbols;
  (B) determining a set of codes, each code of the set of codes corresponding to one of the initial set of the binary representations, determining the set of codes includes the following operations:
    assigning each binary representation that includes a zero in a most significant bit to a current first set;
    assigning each binary representation that includes a one in the most significant bit to a current second set;
    appending a zero to the code associated with each binary representation of the current first set;
    appending a one to the code associated with each binary representation of the current second set;
    removing a set of identical most significant bits from each binary representation assigned to the current first set, wherein the set of identical most significant bits are present in each binary representation of the current first set;
    removing a set of identical most significant bits from each binary representation assigned to the current second set, wherein the set of identical most significant bits are present in each binary representation of the current second set;
  (C) setting the current first set as the initial set of binary representations and repeating (B) in response to determining that the current first set includes greater than a threshold number of binary representations.

2. The method of claim 1, further comprising outputting the codes corresponding to the binary representations of the current first set in response to determining that the current first set includes less than or equal to the threshold number of binary representations.

3. The method of claim 1, wherein the symbol is a Shannon Fano Elias symbol.

4. The method of claim 1, further comprising setting the current second set as the initial set of binary representations and repeating steps (B) in response to determining that the current second set includes greater than a threshold number of binary representations.

5. The method of claim 4, further comprising outputting the codes corresponding to the binary representations of the current second set in response to determining that the current second set includes less than or equal to the threshold number of binary representations.

6. The method of claim 1, further comprising assigning an empty code string to the current first set and to the current second set prior to assigning the initial set of binary representations of the plurality of symbols to the current first set and the current second set.

7. The method of claim 1, wherein the threshold number of binary representations is one.

8. A method comprising:
  receiving a first index of a first dictionary, the first dictionary containing sequences of integers encoded based at least in part on a first compression technique and the first index comprising a first list of integers;
  encoding the first index based at least in part on a second compression technique, the second compression technique to generate a second index and a second dictionary, the second index comprising a second list of integers; and
  outputting the second index as a lookup table to the first index.

9. The method of claim 8, wherein the first compression technique is a technique based at least in part on LZ77 or LZ78.

10. The method of claim 8, wherein the second compression technique is a technique based at least in part on LZ77 or LZ78.

11. The method of claim 8, further comprising encoding the second index based at least in part on the second compression technique to generate a third index and a third dictionary, the third index comprising a third list of integers and outputting the third index as a lookup table to the second index.

12. The method of claim 8, wherein the second compression technique comprises at least one of δ-LZ77, δ-LZ78, δ-LZW, δ-Huffman, δ-Tunstall, δ-arithmetic coding, or δ-Shannon Fano Elias.

13. The method of claim 8, wherein the number of entries in the second dictionary is unbounded.

14. A method comprising:
  for each integer of an input stream containing a plurality of integers:
    (A) setting a value corresponding to a first list to null;
    (B) reading a next integer from the input stream;
    (C) storing the next integer in a temporary variable;
    (D) appending the next integer with the first list to generate a second list;
    (E) in response to determining that the second list is not in the dictionary:
      determining an index value associated with the second list;
      outputting the index and the second list;
      inserting the second list in a dictionary entry associated with the index;
      returning to (A); and
    (F) in response to determining that the list is in the dictionary:
      setting the first list equal to the second; and
      returning to (B).

15. The method of claim 14, further comprising:
  determining that the input stream is empty; and
  outputting the index.

16. The method of claim 15, further comprising determining that the first list is empty prior to outputting the index.

17. The method of claim 15, further comprising determining a delta code of the next integer and wherein appending the next integer with the first list to generate a second list comprises appending the delta code of the next integer with the first list.

18. The method of claim 14, wherein the dictionary entries are bounded and the indexes corresponding to the integers are a fixed length.

19. The method of claim 14, wherein the plurality of integers are unbounded and the indexes corresponding the integers are a uniquely decodable variable length code.

20. The method of claim 19, wherein the indexes are represented as at least one of at least one of δ-LZ77, δ-LZ78, δ-LZW, δ-Huffman, δ-Tunstall, δ-arithmetic coding, or δ-Shannon Fano Elias.

\* \* \* \* \*